(12) United States Patent
Schultz et al.

(10) Patent No.: US 7,130,129 B2
(45) Date of Patent: Oct. 31, 2006

(54) RETICLE-MASKING OBJECTIVE WITH ASPHERICAL LENSES

(75) Inventors: Jorg Schultz, Aalen (DE); Johannes Wangler, Konigsbronn (DE); Karl-Heinz Schuster, Konigsbronn (DE); Alexander Sohmer, Oberkochen (DE); Alexander Epple, Aalen (DE); Jurgen Grunwald, deceased, late of Welzheim (DE); by Christa Müller, legal representative, Welzheim (DE); by Janosch Müller, legal representative, Welzheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/735,172

(22) Filed: Dec. 12, 2003

(65) Prior Publication Data

US 2004/0207928 A1   Oct. 21, 2004

Related U.S. Application Data

(63) Continuation-in-part of application No. 09/969,441, filed on Oct. 1, 2001, now Pat. No. 6,680,803, which is a continuation-in-part of application No. 09/125,621, filed on Aug. 12, 1999, now Pat. No. 6,366,410, which is a continuation of application No. PCT/EP97/06760, filed on Dec. 3, 1997.

(30) Foreign Application Priority Data

Dec. 12, 1996 (DE) ............... 196 53 983
Feb. 23, 2001 (DE) ............... 101 08 677

(51) Int. Cl.
  *G02B 3/02* (2006.01)
  *G02B 9/00* (2006.01)
(52) U.S. Cl. ..................... 359/649; 359/656

(58) Field of Classification Search ........ 359/656–661, 359/649–651, 726–728, 733, 708, 713–716
See application file for complete search history.

(56) References Cited

U.S. PATENT DOCUMENTS

| 4,717,242 A |   | 1/1988 | Echizen et al. |
|---|---|---|---|
| 4,906,080 A |   | 3/1990 | Omata |
| 5,555,479 A | * | 9/1996 | Nakagiri ............... 359/355 |
| 6,366,410 B1 | * | 4/2002 | Schultz et al. ........ 359/649 |
| 2004/0070742 A1 |   | 4/2004 | Suenaga |

FOREIGN PATENT DOCUMENTS

| DE | 292 727 A1 | 8/1991 |
|---|---|---|
| DE | 94 09 744.5 | 10/1994 |
| DE | 44 41 947 A1 | 5/1996 |

(Continued)

OTHER PUBLICATIONS

N. Nomura et al.; "ArF Quarter-Micron Projection Lithography With an Aspherical Lens System"; Microelectronic Engineering, Apr. 1990, vol. 11; pp. 183-186.

*Primary Examiner*—Jordan M. Schwartz
(74) *Attorney, Agent, or Firm*—Darby & Darby

(57) ABSTRACT

A reticle-masking (REMA) objective for imaging an object plane onto an image plane has a condenser portion, an intermediate portion, and a field lens portion. The three portions together have no more than 10 lenses with a combined total of no more than five aspheric lens surfaces. Each of the three portions of the REMA objective has one or two aspheric lens surfaces.

20 Claims, 11 Drawing Sheets

FOREIGN PATENT DOCUMENTS

| | | |
|---|---|---|
| DE | 195 48 805 A1 | 7/1997 |
| DE | 196 53 983 | 6/1998 |
| DE | 199 42 281 A1 | 11/2000 |
| EP | 0 564 264 A1 | 3/1993 |
| EP | 0 811 865 A2 | 12/1997 |
| EP | 1 316 832 A1 | 6/2003 |
| WO | WO-95/32446 A1 | 11/1995 |

* cited by examiner

RETICLE-MASKING OBJECTIVE WITH ASPHERICAL LENSES

CROSS-REFERENCES TO RELATED APPLICATIONS

This application is a continuation-in-part of U.S. patent application Ser. No. 09/969,441, filed Oct. 1, 2001, now U.S. Pat. No. 6,680,803 which is a continuation-in-part of U.S. patent application Ser. No. 09/125,621, filed Aug. 12, 1999 (issued as U.S. Pat. No. 6,366,410 B1 on Apr. 2, 2002), which is a continuation of International Application PCT/EP 97/06760, filed Dec. 3, 1997, which published in German as WO 98/28644. All of the aforementioned documents are incorporated herein by reference.

BACKGROUND OF THE INVENTION

1. Field of the Invention

The invention relates to a REMA objective. This is an objective with which a Reticle Masking (REMA) device is imaged in the plane of the reticle which carries the structured mask for lithography. The region which is lighted on the reticle is thus sharply delimited. The reticle masking device is usually constructed with adjustable blades.

A REMA objective is used in microlithographic projection apparatus (steppers or scanners).

The invention further relates to a partial objective in an illuminating system of a microlithographic projection exposure apparatus; to a REMA objective that has a partial objective of this kind; and to a microlithographic projection exposure apparatus with a partial objective of this kind.

The partial objective comprises a first and a second lens group. If the partial objective is part of a REMA objective the first and second lens group are also referred to herein as intermediate portion and field lens portion of the REMA objective. The partial objective is arranged between an aperture plane and an image plane, an image field to be illuminated being situated in the image plane. The components are arranged centered about an optical axis. Pencils of rays, each with a respective chief ray, enter the partial objective through the aperture plane; the chief rays intersect the optical axis in the region of the aperture plane. The axial distance of the intersection points of the chief rays with the optical axis is here at most 10% of the diameter of the aperture diaphragm. The axial displacement of the intersection points depends on the aberrations of pupil imaging introduced by the portions of the system arranged before the partial objective. Pupil imaging denotes here imaging between pupil planes. The outermost chief ray, which passes through the aperture plane at the maximum angle to the optical axis, strikes the edge of the image field in the image plane. The ray bundle whose chief ray runs along the optical axis defines a central ray bundle. The first lens group then comprises those lenses in which the outermost chief ray has, according to absolute value, smaller ray heights at the lens surfaces than the marginal ray of the central ray bundle. The second lens group comprises those lenses in which the outermost chief ray has, according to absolute value, greater ray heights at the lens surfaces than the marginal ray of the central ray bundle. A lens of the second lens group has an aspheric lens surface here.

2. Description of the Related Art

An illuminating device for a microlithography projection illumination device is known from DE-U-94 09 744 (U.S. Pat. No. 5,646,715) in it there are provided, in the following sequence: light source, shutter, coupling lens (zoom-axicon), glass rod as integrator, reticle masking system, REMA objective for imaging on the reticle the intermediate field plane located in the reticle masking system, containing a first lens group, a pupil intermediate plane, a second lens group, a deflecting prism, a third lens group, and the reticle plane with the reticle. After this there follows a projection objective, which normally reduces and which contains—for example with a non-telecentric input—an internal pupil plane, and then the wafer in the image plane.

In the system according to EP 0 526 242 A1, a objective is first provided after the integrator, here a honeycomb condenser, before the reticle masking system follows. The reticle masking system is optically conjugate to the reticle plane via two lens groups and a mirror, and is thus imaged. Likewise, the diaphragm at the exit of the integrator—the secondary light source—is imaged by the two lens groups and portions of the projection objective on the pupil of the projection objective. Nothing is said there about imaging errors.

A high-aperture catadioptric reduction objective for microlithography is described in the Applicant's WO 95/32446 (U.S. Pat. No. 5,742,436); its embodiment example according to FIG. 3 and Table 2 is exactly matched by the embodiment example of a REMA objective shown in FIG. 1 herein.

The Laid-Open Patent Application DE-A 195 48 805 (U.S. Pat. No. 5,982,558) of Dec. 27, 1995, which was first published after the priority date, describes REMA objectives with exclusively spherical lens surfaces. The embodiment example there has 13 lenses and is very similar in its optical properties to the embodiment example shown herein in FIG. 1. Both the REMA objective of DE-A 195 48 805 (U.S. Pat. No. 5,982,558) and the REMA objective of Figure represent an excellent match, in regard to their pupil function, to the projection objective of WO 95/32446 (U.S. Pat. No. 5,742,436).

U.S. Pat. Nos. 5,742,436, 5,982,558, and 5,646,715 corresponding, respectively, to WO 95/32446, DE-A 195 48 805, and DE-U-94 09 744, are therefore expressly incorporated herein by reference.

A microlithographic projection exposure device is known from DD 292 727, and has a partial objective of the category concerned between a fly's eye condensor and a structure-carrying mask. A projection objective follows the structure-carrying mask in the beam path, and images the structure-carrying mask, diffraction limited, onto a photosensitive substrate. The first lens group of the partial objective corresponds to the collimator in DD 292 727. The second lens group corresponds to a field lens consisting of only one lens. The field lens has an aspheric correction surface here, in order to affect the angular distribution of the chief rays in the image plane of the partial objective such that the image plane of the projection objective is illuminated nearly telecentrically. The aberrations of pupil imaging between the aperture plane of the partial objective and the aperture plane of the projection objective are reduced by the aspheric correcting surface. The possibilities of correction of pupil imaging with the arrangement of DD 292 727 are limited, since the field lens consists of only a single lens with positive refractive power. Moreover, the embodiment has only an image-side numerical aperture of 0.04 and a maximum field height of 71.75 mm.

European Patent Application EP 0 811 865 A2 shows a partial objective, which is arranged between an aperture plane and an image plane. Here not the reticle, but a masking device, is arranged in the image plane of the partial objective, and is imaged onto the reticle by a following objective.

Therefore, the partial objective has no direct influence on the distribution of the chief ray angle at the interface between the illuminating device and a following projection objective.

Microstructured components with structure sizes below 0.2 µm can be produced with modern projection objectives. In order to attain these high resolutions, the projection objectives are operated at wavelengths of 248 nm, in particular 193 nm or even 157 nm, and have image-side numerical apertures of greater than 0.65. At the same time, the image field diameter is for the most part greater than 20 mm. The requirements on the optical design for such a projection objective are, therefore, considerable. Besides the field imaging of the reticle onto the photosensitive substrate, the so-called wafer, the pupil imaging is also to be corrected. Thus the forward objective portion, arranged between the object plane and the aperture plane, of a projection objective influences the imaging of the entrance pupil onto the aperture plane, while the rearward objective portion, arranged between aperture plane and image plane, influences the imaging of the aperture plane onto the exit pupil. The aberrations of pupil imaging of the projection objective then become apparent in the distribution of the chief ray angles in the object plane of the projection objective.

OBJECT OF THE INVENTION

The invention has as its object to provide a REMA objective which has considerably fewer boundary surfaces, at which reflection losses occur, and a considerably smaller glass path, in which absorption takes place, and thus a substantially improved degree of transmission efficiency. This is not to lead to any curtailment of the optical properties.

Another object of the invention is to provide partial objectives of the category described above, which permit influencing the distribution of the chief ray angles in the image plane of the partial objective over wide ranges. In particular, aberrations of pupil imaging that are introduced by the forward objective portion of a following projection objective are to be compensated.

SUMMARY OF THE INVENTION

A REMA objective according to this invention has a few, at most four or five, aspheric elements.

A REMA objective according to the invention has a light-conducting value (also referred to as "etendue" or "Helmholtz-Lagrange invariant") greater than 10 mm. The image of a bright/dark edge projected from an object plane onto a reticle plane results in a transition zone at the edge where a 5% brightness level and a 95% brightness level are mutually separated by less than 2% of the image field diameter. The REMA objective according to the invention has no more than 10 lenses with a total of 1 to 5 aspheric surfaces.

It is known per se that aspheric elements open up new correction possibilities, and lenses can be saved thereby. However, it is also clear that aspheric elements drastically increase the cost of production and of quality testing, so that they have to be used sparingly, with due regard to their number and their deviation from a spherical shape.

A respective reduction of the number of lenses and the glass path to below 60%, with only three to four, at most five, aspheric elements, whose deviations from sphericity are moderate, has surprisingly been achieved. Furthermore, the high requirements on a REMA objective are then fulfilled, and the efficiency (the transmission) is nevertheless clearly increased.

The further object of the invention (i.e., to provide partial objectives with the specific properties stated above under "Object of the Invention") is attained with a partial objective having an optical axis for illumination of an image field, in particular in an illuminating device of a microlithographic projection exposure apparatus. The partial objective is arranged between an aperture plane and an image plane. Pencils of rays, each with a chief ray, start from the aperture plane, and the intersection points of the chief rays with the optical axis are situated apart by at most 10% of the diameter of the aperture plane. The partial objective comprises a first lens group and a second lens group, wherein within the first lens group, an outermost chief ray that passes through the aperture plane at a maximum angle to the optical axis, has according to absolute value smaller ray heights at the lens surfaces than an marginal ray that bounds the pencils of rays whose chief ray runs along the optical axis. Within the second lens group, the outermost chief ray has according to absolute value greater ray heights at the lens surfaces than the marginal rays, wherein the second lens group has at least a first lens with negative refractive power and at least a second lens with positive refractive power, and wherein either the first or the second lens or another lens of the second lens group—if the latter has more than two lenses— has a first aspheric lens surface. The maximum field height $Y_{im}^{max}$ within an image field is at least 40 mm, and the image-side numerical aperture is at least 0.15. The chief rays within the image field have field height $Y_{im}$ and chief ray angles PF between the surface normals of the image plane (IM) and the respective chief rays. The distribution of the chief ray angles PF over the field heights $Y_{im}$ is given by a pupil function $PF(Y_{im})$, which consists of a linear and a non-linear contribution $PF(Y_{im})=c1 \cdot Y_{im}+PF_{NL}(Y_{im})$, with c1 corresponding to the slope of the pupil function at the field height $Y_{im}=0$ mm, and the non-linear contribution being at least +15 mrad for the maximum positive field height $Y_{im}^{max}$.

The distribution PF of the chief ray angles over the field heights $Y_{im}$ in the image plane of the partial objective according to the invention, the so-called pupil function, can be represented as a polynomial series development with odd powers. The polynomial series is:

$$PF(Y_{im}) = \sum_{n} c_n Y_{im}^n \quad (n = 1, 3, 5, 7, 9 \ldots ) \qquad (1)$$

The chief ray angles PF, which are determined between the surface normals of the image plane and the respective chief rays, are defined to be negative in the clockwise direction. On grounds of symmetry, the pupil function for a system centered around the optical axis has no contributions with even powers. Were the illuminating system to have no aberrations of pupil imaging in the image plane of the partial objective according to the invention, there would then result for each field height $Y_{im}$ the same axial position of the exit pupil, and thus a homocentric exit pupil. Since in homocentric exit pupils all chief rays intersect the optical axis at one point, there exists exclusively a linear connection between the field height $Y_{im}$ and the tangent of the angle for each chief ray. With very small chief ray angles, as will be the case in what follows, the tangent of the chief ray angle can be directly approximated by the angle. The pupil function for a homocentric pupil has only a linear contribution $c1 \cdot Y_{im}$, where the coefficient c1 corresponds to the slope of the pupil function at $Y_{im}=0$ mm. However, due to the aberrations of pupil imaging, there results a different axial position of the exit pupil for each field height. The field-dependent position of the exit pupil is described by the non-linear contribution $$PF_{NL}(Y_{im}) = \sum_n c_n Y_{im}^n \quad (n = 3, 5, 7, 9 \ldots) \qquad (2)$$

of the pupil function. The contributions of higher order correspond here to the spherical angular aberration of the pupil imaging, and thus to the spherical aberration expressed as angular aberration. An optical system with positive refractive power is usually spherically undercorrected without special correction measures, so that the non-linear contribution $PF_{NL}$ of the pupil function is negative for a positive field height. In contrast to this, the pupil function of the partial objective according to the invention has a non-linear contribution $PF_{NL}$ which is clearly positive for positive field heights. The non-linear contribution $PF_{NL}(Y_{im}^{max})$ to the chief ray angle is at least +15 mrad for the maximum positive field height $Y_{im}^{max}$. The partial objective thus introduces a strong overcorrection of the spherical aberration of pupil imaging. This is particularly advantageous because the following projection objective can thereby be spherically undercorrected, and correction means in the projection objective can thereby be saved. It is always more favorable to install these correction means in the illuminating system, since the quality requirements on optical elements in a projection objective are clearly higher than those on optical elements in the illuminating system. The partial objective according to the invention now attains this overcorrection in an image field which has a diameter of at least 80 mm, and whose image-side numerical aperture is at least 0.15. The image-side numerical aperture denotes here the numerical aperture in the image plane, which is possible due to the maximum aperture diaphragm diameter of the partial objective. The etendue (or Helmholtz-Lagrange invariant), which is defined in this case as the product of the image field diameter and the image-side numerical aperture, is at least 10 mm, preferably at least 12 mm. The overcorrection of the spherical aberration of pupil imaging can be attained when the second lens group of the partial objective according to the invention consists of at least two lenses, a first lens having a negative refractive power and a second lens having a positive refractive power.

It is advantageous for the correction of spherical aberration of pupil imaging when the first lens of negative refractive power has a lens surface concave to the image plane, so that the radius of curvature of this surface is positive. It is then favorable if the ratio of radius of curvature to lens diameter of the concave lens surface is smaller than 1.0, preferably smaller than 0.8. This ratio is bounded below by the value 0.5, which results for a hemisphere. Due to the strongly curved concave lens surface, large angles of incidence of the chief rays of the image points remote from the axis result on this lens surface, and thereby a large contribution results to the overcorrection of the spherical aberration of pupil imaging.

The first lens of negative refractive power is preferably designed as a meniscus. In meniscus lenses, the vertex radii of the front and back surfaces have the same sign.

The first lens with negative refractive power is then to be arranged as close as possible to the image plane. It is advantageous if, up to plane-parallel surfaces such as filters or closure plates, which can also be provided with correction surfaces having random surface profiles, no further optical elements are arranged in the beam path between the first lens and the image plane.

It is advantageous for the correction of field imaging, and thus of the imaging of the pencils of rays in the image plane, when the concave lens surface of the first lens is a surface nearly concentric with the image plane. In this case, the rays of the central ray bundle pencil strike the concave lens surface with small angles of incidence. This occurs when the ratio of the distance of the image plane from the vertex of the concave lens surface to the absolute value of the radius of curvature of the concave lens surface has a value between 0.7 and 1.3. While the rays of the central ray bundle pass nearly unrefracted through the lens surface which is nearly concentric with the image plane, large angles of incidence result for the ray pencils of the image points remote from the axis. The surface can thus be used ideally for the correction of the field-dependent image aberrations, while the central ray bundle remains nearly uninfluenced.

If no further lenses with optical refractive power are situated between the first lens, with the lens surface concave to the image plane, and the image plane, it is advantageous if half the radius of curvature of the concave lens surface is clearly greater or smaller than the distance of the vertex of the concave lens surface from the image plane. This requirement on the radius of curvature of the concave lens surface comes into play when the reticle is situated in the image plane and usually reflects a portion of the incident light rays back in to the partial objective. Since each optical surface has a residual reflection, even with an antireflective coating, the light reflected from the mask would be reflected back again toward the mask at the lens surface concave to the image plane. With a nearly telecentric illumination of the mask, a undesired reflection would result if the image plane were situated at the distance of the focal length of the concave lens surface acting as a mirror. The focal length of a concave mirror is given by half the radius of curvature. A undesired reflection can be neglected when the absolute value of the difference of the distance of the concave lens surface from the image plane and the focal length is greater than the absolute value of the focal length multiplied by the factor 0.3.

Minimizing the undesired reflections can also be considered for the other surfaces of the second lens group. So that no undesired reflections arise between the reticle and the lens surfaces of the second lens group, the second lens group is constructed such that the outermost chief ray, which passes through the aperture plane at a maximum angle to the optical axis, has after a reflection at the image plane and a reflection at a lens surface of the second lens group, a ray height in the image plane which is at least 30% of the maximum field height $Y_{im}^{max}$. With a constant refractive power of the partial objective, this can be attained by the variation of the curvature of the lens surfaces. The outermost chief ray is therefore made use of for the estimation of the undesired reflections, since its intersection with the image plane marks the 50% point of the undesired reflection light distribution. If however the outermost chief ray were to intersect the image plane in the region of the optical axis, all further chief rays would likewise intersect the image plane in this region, and the doubly reflected pencils of rays would strike it in a narrow region around the optical axis, thus resulting in undesired ghost image.

The first aspheric lens surface is distinguished by a large sag difference of at least 0.2 mm, preferably 0.4 mm, with respect to an envelope sphere. These large asphericities are a further means of correction in order to provide the overcorrection of the spherical aberration of pupil imaging. The sags are defined as distances between the aspheric lens surface and the envelope sphere in the direction of the optical axis. The envelope sphere denotes a spherical surface which has the same vertex as the aspheric surface and which intersects the aspheric lens surface at the edge of the illuminated region of the aspheric lens surface. The illuminated region is bounded by the marginal rays of the ray bundle of the outermost chief ray.

In addition, the design of the partial objective is made more difficult in that the image-side working distance of the partial objective is to be at least 30 mm, and preferably at least 40 mm. The free working space denotes here the distance of the image plane from the vertex of the last optical surface of the partial objective, this distance being reduced by the maximum sag of the last optical surface in the case that a concave surface is concerned for this surface. The free working distance makes possible free access to the image plane, in which the reticle is usually situated. Apparatuses for the positioning and change of the reticle have to be able to intervene in this space.

It is possible with the partial objective according to the invention to overcorrect the spherical aberration of pupil imaging such that the non-linear contribution $PF_{NL}(Y_{im}^{max})$ to the chief ray angle amounts to at least +25 mrad for the maximum positive field height $Y_{im}^{max}$.

This can be attained in that, inter alia, the second lens group has a second aspheric lens surface.

The maximum sag difference of the second aspheric lens surface from the envelope sphere is to be as much greater than 0.2 mm as possible, preferably greater than 0.4 mm.

It is advantageous if, for the maximum field height $Y_{im}^{max}$, the ratio of the non-linear contribution $PF_{NL}(Y_{im}^{max})$ to the linear contribution $c1 \cdot Y_{im}^{max}$ lies in the range of −0.5 and −2.0. The non-linear portion of the pupil function can then be partially compensated by the linear portion for the maximum field height, so that for the positive field heights nearly equally large maximum and minimum chief ray angles result, and the chief rays for these field heights run on average parallel to the optical axis. The linear portion of the pupil function is set by the paraxial position of the exit pupil.

Apart from influencing the spherical aberration of pupil imaging, the partial objective focuses the incident ray bundle to spot images with minimum diameter in the image plane. For this purpose, the correction of field imaging is required. The maximum spot diameter for all spot images is preferably 2% of the maximum field height $Y_{im}^{max}$. For the determination of the spot image and the spot diameter, the ray bundle at full opening of the aperture diaphragm is considered, so that the pencils of rays illuminate the maximum image-side numerical aperture. The spot image is then given by the penetration points of a ray bundle with the image plane. Primarily, the first lens group is available as the correction means; it advantageously consists of a meniscus with positive refractive power and a meniscus with negative refractive power. In addition, it is favorable to provide an aspheric lens surface in the first lens group.

It is favorable for the simultaneous correction of pupil imaging and field imaging if the second lens is a meniscus with positive refractive power.

The second lens group advantageously consists of three through five lenses, in order to correct field imaging, to overcorrect the spherical aberration of pupil imaging, and to ensure a uniform illumination of the image field.

This is in particular possible by the additional use of a biconvex lens in the second lens group.

The partial objective according to the invention can be advantageously used within a REMA objective, where the REMA objective images an object field onto an image field. The REMA objective consists of a first partial objective between the object plane and the aperture plane, and the partial objective according to the invention. The two partial objectives have a common optical axis. The magnification of the REMA objective can be adjusted by means of the ratio of the focal lengths of the first and second partial objectives. Chief rays starting from the object plane do not necessarily intersect the aperture plane in one point when the pupil imaging of the first partial objective or of the optical components arranged before the REMA objective introduce aberrations to the pupil imaging.

Since the REMA objective is to image the masking device arranged in the object plane of the REMA objective as sharply as possible onto the image plane in which the reticle is arranged, the spot images of the object points have a minimum diameter in the image plane. The maximum diameter of the spot images is 2% of the maximum field height $Y_{im}^{max}$. For the determination of the maximum spot diameter, pencils of rays are used at the maximum aperture diaphragm diameter, which corresponds to the maximum image-side numerical aperture.

The entrance pupil of the REMA objective is advantageously situated at infinity, so that the chief rays of the pencils of rays after the object plane run parallel to the optical axis and thus telecentrically. By means of this measure, the magnification ratio of the REMA objective is independent of a defocusing of the object, in this case the masking device.

Besides the chief rays, which are defined by means of pupil imaging, the energy-weighted average rays in the image plane of the REMA objective are also of importance. The energy-weighted average ray of a ray bundle here represents the ray which results from an averaging over all the rays of the ray bundle under consideration, where each ray has an energetic weighting according to the illumination of the entrance pupil. For a field height $Y_m$, the direction of the corresponding energy-weighted average ray depends on the aberrations of the REMA objective in connection with the illumination of the entrance pupil of the REMA objective. The energy-weighted average rays can be determined, for example, for a complete illumination of the entrance pupil, or for an only partial illumination of the entrance pupil, the illumination being respectively nearly point-symmetrical with respect to the optical axis. The REMA objective is now constructed such that the maximum angular deviation between the energy-weighted average ray and the chief ray for all field heights is smaller than 2 mrad, preferably smaller than 1 mrad. This requirement, together with the requirements on the field imaging and pupil imaging, is attained with a REMA objective which includes eight through twelve lenses with finite focal length, the first partial objective having three through five lenses, and the second partial objective having five through seven lenses. In addition, the use of three through five aspheric lenses is advantageous.

The partial objective according to the invention is advantageously used in a microlithographic projection exposure apparatus, in which a projection objective directly follows the partial objective. The interface between the illumination system and the projection objective thus represents the image plane of the partial objective or the object plane of the projection objective, respectively. The partial objective and the projection objective are centered about a common optical axis. In order to ensure a continuous course of the pencils of rays of the illumination system and the projection objective, the distribution of the chief ray angles of the partial objective has to be matched to the distribution of the chief ray angles of the projection objective at this interface. The deviation of the pupil function of the partial objective from the object-side object pupil function is in this case advantageously smaller than 2 mrad for all field heights within the image field of the partial objective, preferably smaller than 1 mrad. If this condition is fulfilled, the partial objective and the projection objective then form a functional unit with respect to pupil imaging, matched to the partial objective according to the invention, the projection objective can then have a distinct undercorrection of the spherical aberration of pupil imaging, since the aberrations of the projection objective can be compensated with the partial objective. This substantially relieves the optical correction of the projection objective.

Correspondingly, it is advantageous to use a REMA objective in a microlithographic projection exposure apparatus, the REMA objective including a partial objective according to the invention.

BRIEF DESCRIPTION OF THE DRAWINGS

The detailed description of the invention which follows below refers to the attached drawings, wherein.

DETAILED DESCRIPTION OF THE INVENTION

Figure 1:
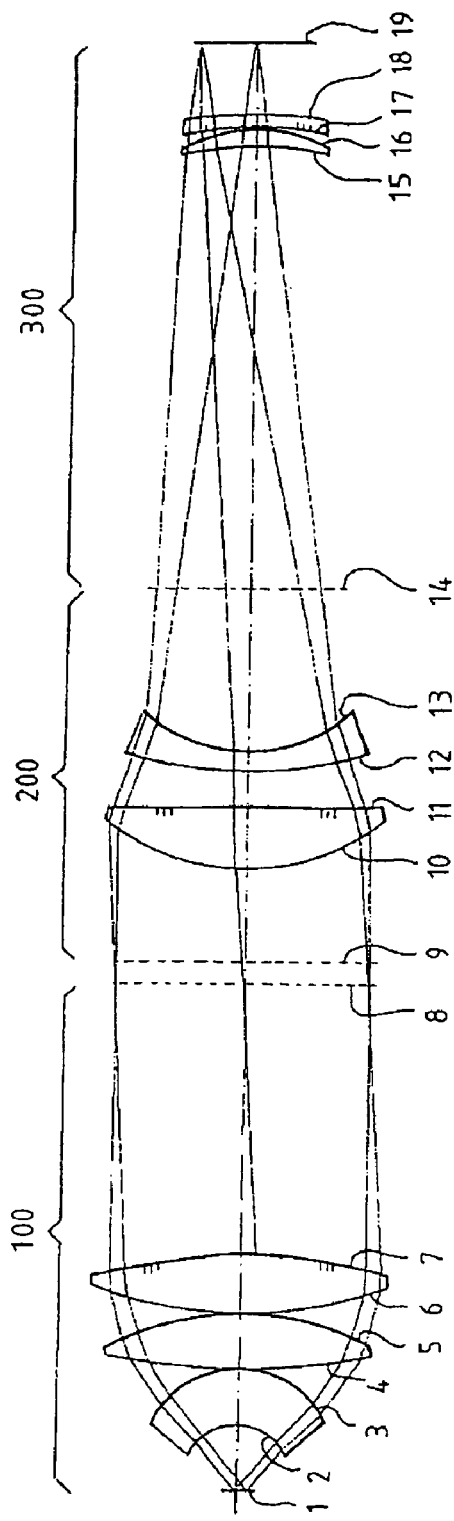
FIG. 1 shows a section of the lenses of a first embodiment of a REMA objective with three aspheric elements.

The first embodiment example of a REMA objective with the lens section of FIG. 1 has the data of Table 1. It consists of a condenser portion 100, constructed as a partial objective, in front of the aperture diaphragm 8, an intermediate portion 200, and a field lens portion 300, wherein the intermediate portion 200 and the field lens portion 300 are construed as a further partial objective. The REMA objective has an image field diameter greater than 80 mm and an image side numerical aperture of greater than 0.10. An aspheric element 7, 11, 17 is provided in each of these portions. Thus the REMA objective has only seven lenses. The planar surfaces 9 and 14 have only a positioning function. A deflecting mirror (240 in FIG. 2) can be arranged in the region of 14.

The description of the aspheric surfaces is according to the formula:

$$p(h) = \frac{h^2}{R + \sqrt{R^2 - (1+k) \cdot h^2}} + \sum_{n=1} c_n h^{2n+2}$$

Here p is the arrow height, h the distance from the optical axis, R is the vertex radius, k the conical constant and c1 through cn are the aspheric constants. All optical surfaces with a rotationally symmetrical deviation from the best-matched sphere of greater than about 5 micrometers are considered to be aspheric surfaces. The usable asphericities are predominantly of the order of magnitude of 0.1–1 mm (typically, up to 2 mm). The objective images the object plane 1 in which the reticle masking system is arranged, with an object to image distance of 1200 mm, onto the reticle plane 19. The air spaces at the object plane 1, at the diaphragm plane 8, between the intermediate portion 200 and the field lens portion 300, and also at the reticle plane 19, are generous, so that the portions arranged there—the REMA system 90, correcting elements in the diaphragm plane, a deflecting mirror 240, and the handling system 330 (see FIG. 2) for the reticle—can be installed without causing problems.

The main function of a REMA objective is the imaging of a bright/dark edge (blade of the REMA diaphragm) from the object plane 1 to the reticle plane 19 with a transition zone in which a 5% brightness level and a 95% brightness level are mutually separated by less than 5%, preferably less than 2%, more preferably less than 0.5%, of the image field diameter. The first embodiment certainly fulfills this function: The separation is 0.4% of the image field diameter of 84.2 mm. With this datum, an integral measure for all image errors in the whole image field is given which is oriented directly to the function of the REMA objective. This good correction is difficult, since the REMA objective has the considerable light conducting value of 11.4 mm (product of the object field diameter, 19 mm, and the numerical aperture NAO on the object side, 0.6).

The magnification of the REMA objective is 4.444:1.

A further basic function of the REMA objective is that in each point of the image plane, the incident chief ray, i.e. the central beam of the incident light cone, differs only slightly from the predetermined chief ray of a succeeding projection objective, and in fact by less than 3 mrad, preferably less than 2 mrad. This is of equal importance with the requirement that a predetermined pupil function (see FIG. 3) in the reticle plane must be reproduced with minimal deviations. As shown in FIG. 4, this is satisfactorily attained.

Figure 3:
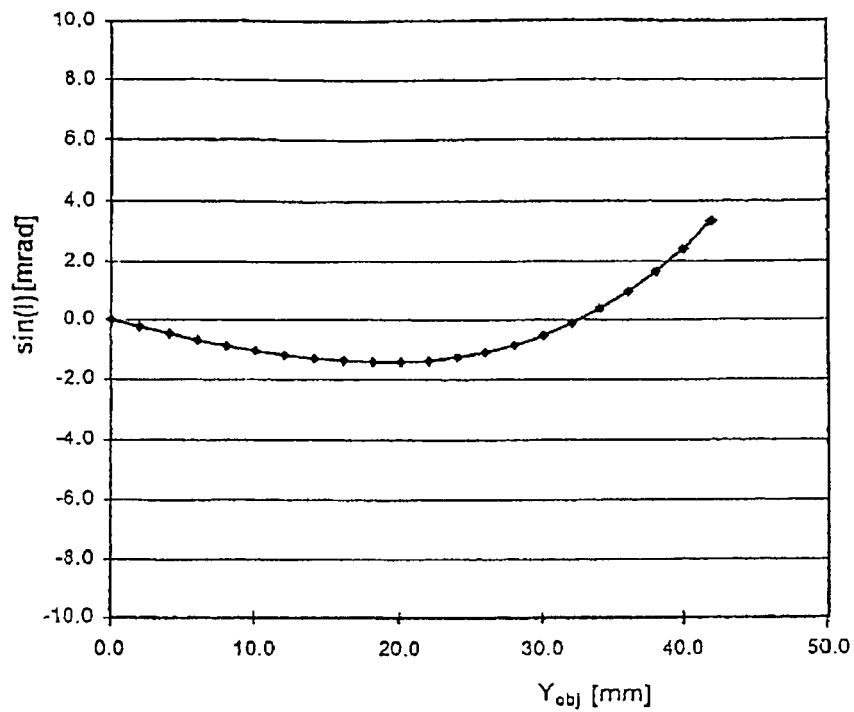
FIG. 3 shows a predetermined pupil function.
Figure 4:
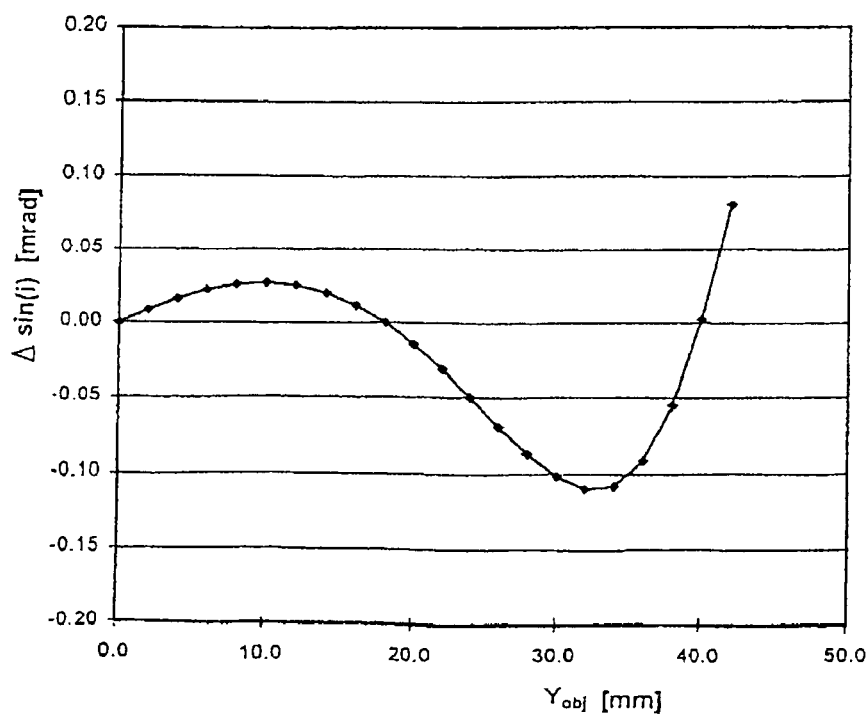
FIG. 4 shows deviations from the pupil function shown in FIG. 3, realized in an example.

In FIG. 3, the sine of the chief ray angle, sin(i), is shown as a function of the image height YB in the reticle plane 19, and correspondingly in FIG. 4, the deviation sin(i) which lies in a band of ±0.11 mrad about zero.

The starting point was the matching to double-telecentric projection objectives, so that the REMA objective is likewise telecentric with high accuracy on the image side. It is also absolutely telecentric on the object side.

The design of the field lens group 300 is decisive for matching. In the example, it is reduced to the minimum of two lenses, the collecting lens 15, 16 and the divergent lens 17, 18. The aspheric element then required—as otherwise many spherical elements would be required—is the surface 17. The chief ray heights are greater than the marginal ray heights in this region.

One of the surfaces, preferably the last surface 18, can also be made planar, so that it is suitable for carrying a gray filter as a thin layer for controlling the intensity distribution on the reticle.

The condenser part 100 is constructed as a partial objective, the object plane of which is at infinity. The diaphragm lies in the object plane 1 of the whole objective, and the image plane lies in the diaphragm 8 of the whole objective. The marginal rays of the partial objective thus correspond to telecentric chief rays of the whole objective, and the chief rays of the partial objective correspond to the marginal rays of the whole objective.

The image of this partial objective (condenser portion 100) in the plane of the diaphragm is to be corrected as well as possible, since thereby correcting elements can be arranged in this plane, and a clean diaphragm function is achieved. Accordingly the coma, expressed as transverse deviation, is made smaller in its maximum value than 1%, preferably smaller than 0.2%, of the image field diameter of this partial imaging. In the example, 0.08% is reached. For this purpose, the condenser portion contains at least one concave surface curved toward the object 1, for which the relative ratio of radius of curvature to the lens diameter lies close to the minimum of 0.5 for the half sphere. In the example, the value at the surface 2 is equal to 0.554. In general, it is to be chosen smaller than 0.65.

By the use of one aspheric element 7 (as in FIG. 1) or two aspheric elements, three (2/3, 4/5, 6/7) or four lenses are sufficient to realize these functions of the condenser part 100.

The intermediate portion 200 likewise has an aspheric element 11. A lens pair 10/11, 12/13 is now sufficient, with the surface 13 fulfilling the following condition: It is a curved surface with $|\sin (i_{edge})| \geq 0.8$ NAO. This surface 13 thus effects a strong refraction in the edge region. For the REMA objective according to the invention, this marginal ray angle is typically greater than 0.6 NAO in any case.

The REMA objective according to the invention thus has all the functions of the REMA objective according to DE 195 48 805.9 (U.S. Pat. No. 5,982,558); the first embodiment of the example according to FIG. 1 can be directly substituted for the embodiment example there of FIG. 1. However, the effect of the few aspheric elements 7, 11, 17 is drastic.

The condenser part 100 shrinks from 5 to 3 lenses; the intermediate part 200 is now sufficient with only 2–4 lenses, and the number of lenses in the field lens portion 300 is likewise halved to 2. In all, in this embodiment example, only 7 lenses are still present (a maximum of 10 in other embodiments).

The glass path, and accordingly the sum of all glass thicknesses of the lenses on the optical axis, here amounts to only 235 mm, in contrast to 396 mm in the older Application DE 195 48 805.9 (U.S. Pat. No. 5,982,558), for an object-image distance 1–19 of 1200 mm in both cases. The glass path is thus reduced by over 40%, and the fraction at the object image distance amounts to only 20%, and even in other embodiments only up to 25–30% of the object image distance.

The transmission of high quality quartz glass at 248 nm is about 99.9 %/cm. The value is reduced by ageing processes (radiation damage, formation of color centers) in the course of operation. With high-quality antireflection layers on the glass-air boundary layers, a transmittance of about 99.5% can be attained at 248 nm.

While the REMA objective according to DE 195 48 805.9 (U.S. Pat. No. 5,982,558) reaches a maximum of 84.4% transmission efficiency, the value for the example according to FIG. 1 is after all 91.1%.

This improvement of the transmission efficiency is still more important for systems for shorter wavelengths, for example, 193 nm, since the transmission of quartz (and also of possible alternatives) markedly falls, and the provision of antireflection layers is more difficult. At the same time, even more importance is attached to the material costs, and the laser performance is more expensive and hence the light losses are also more expensive.

Since the present construction can be matched to the situations at other wavelengths, particularly lower wavelengths, taking account of the altered refractive index, the invention is of particular value for this development to lower wavelengths.

Figure 2:
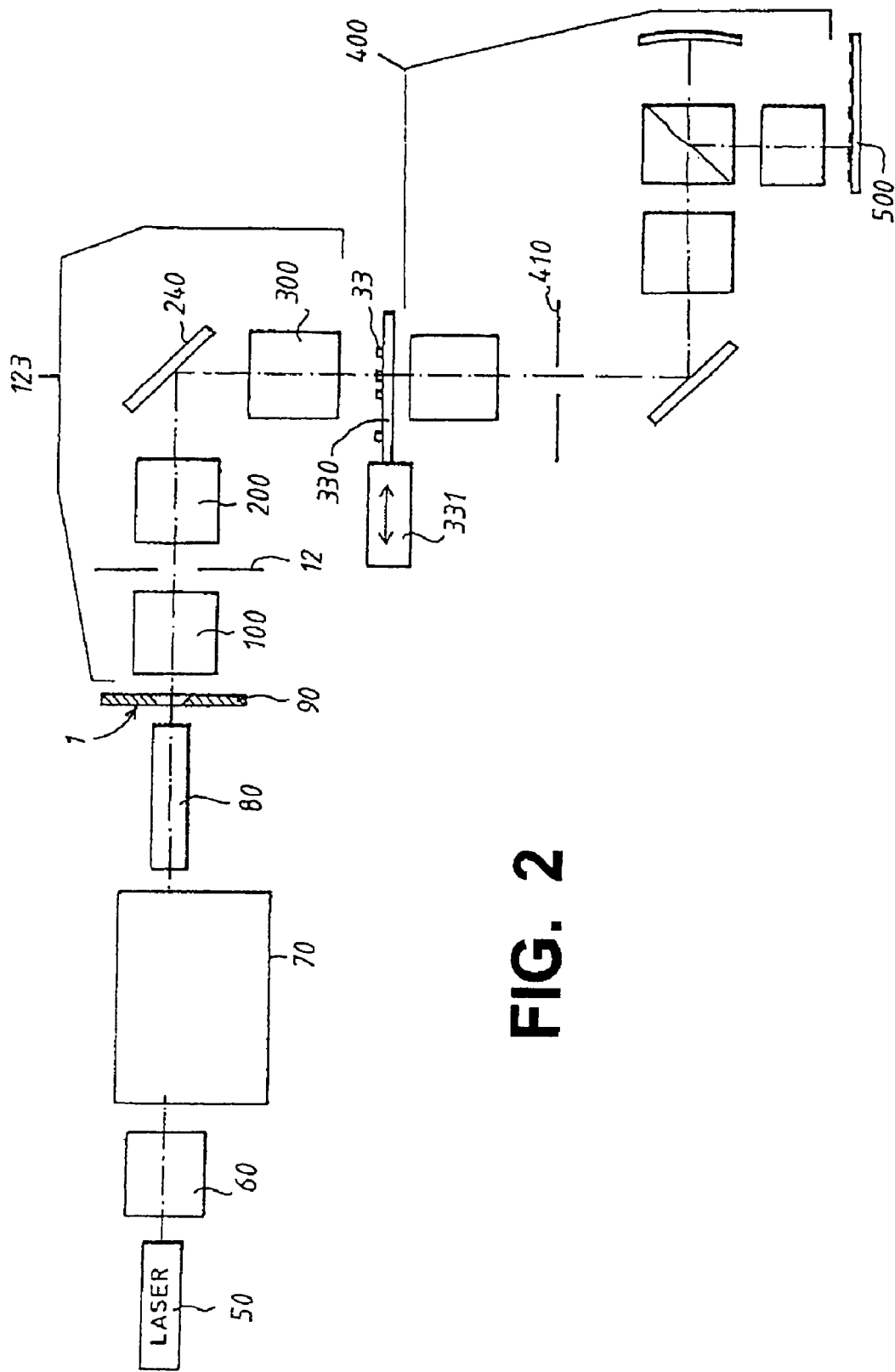
FIG. 2 schematically shows a first embodiment of a microlithography projection illumination device.

FIG. 2 shows a schematic overview of the optical part of a first embodiment of a complete projection exposure apparatus, into which the REMA objective 123 according to the invention is integrated.

A KrF excimer laser 50 with a wavelength of 248 nm is used as the light source. A device 60 serves for beam formation and coherence reduction. A zoom axicon objective makes possible the setting of different kinds of illumination according to requirements. The whole arrangement (apart from the features of the REMA objective 123 according to the invention) is known from EP-A 0 687 956 (U.S. Pat. No. 5,675,401) or from DE-U 94 09 744 (U.S. Pat. No. 5,514,125) (both due to the Applicant). The light is coupled into the glass rod 80, which serves for mixing and homogenizing.

Immediately thereto there adjoins the reticle masking system 90, which lies in the object plane 1 of the REMA objective. This consists of the first lens group 100, the pupil plane (diaphragm plane) 12, the second lens group 200, the deflecting mirror 240, the third lens group 300, and the image plane 33. The reticle 330 is arranged here, and is precisely positioned by means of the changing and adjusting unit 331. There follows the catadioptric projection objective 400 according to WO 95/32446 (U.S. Pat. No. 5,742,436), with the pupil plane 410. The entrance pupil of course lies close to infinity in front of the projection objective, in the embodiment example of Tables 1 and 2. The wafer 500 is arranged in the image plane.

Figure 5:
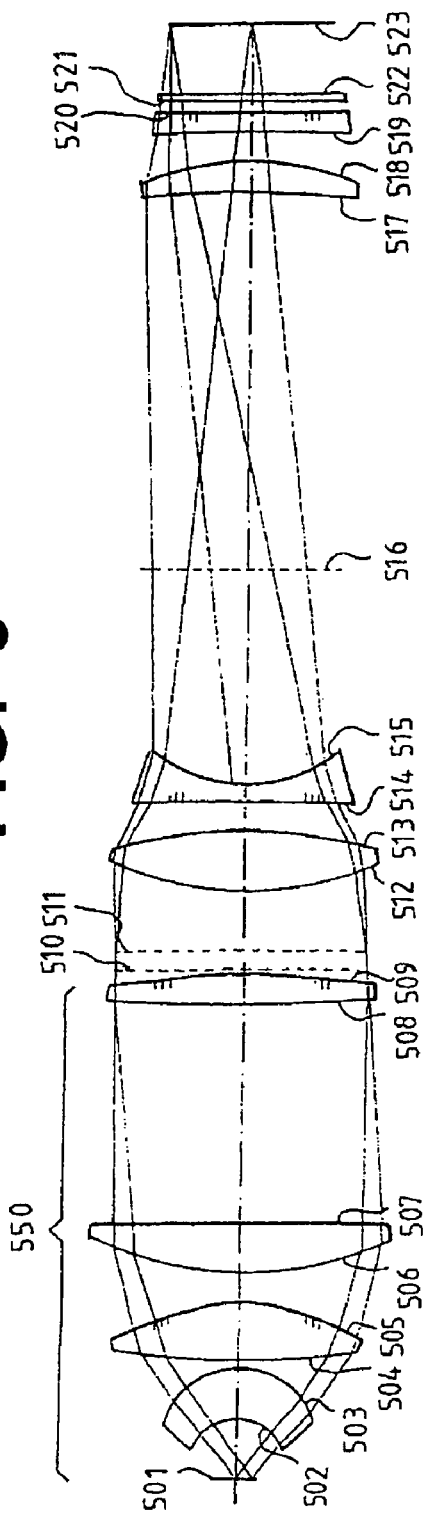
FIG. 5 shows a lens section of a second embodiment example with four aspheric elements.

FIG. 5 shows the lens cross section of the second embodiment example with aspheric elements 505, 509, 514 and 520, and a total of 18 boundary surfaces of 8 lenses and a flat plate 521, 522. Table 2 gives the dimensions for this. The imaging scale (4.730:1) and image field (diameter 127 mm) do not substantially differ here from the example of FIG. 1. The light conducting value of 16.2 mm is of course greater.

Here also, the number of lenses and the glass path are already drastically reduced, at 22% of the object-image distance, as against a purely spherical design. As a comparison with FIG. 1 shows, the condenser part 550 with 4 lenses here, of which 2 have aspheric elements 505, 509, still has capabilities of optimization. Nevertheless, the improvement over a purely spherical REMA objective is already considerable, with the moderate use of aspheric elements.

TABLE 1

Lens Data for REMA Objective of FIG. 1
Scale Ratio: 4.444:1 Wavelength: 248.33 nm

|   | Radius | Thickness | Material |
|---|---|---|---|
| 1 |  | 55.240 |  |
| 2 | −38.258 | 46.424 | Quartz |
| 3 | −66.551 | .633 |  |
| 4 | 881.696 | 45.341 | Quartz |
| 5 | −190.791 | .924 |  |
| 6 | 374.111 | 47.958 | Quartz |
| 7 | −287.518 | 222.221 |  |
| 8 | Diaphragm | 17.900 |  |
| 9 | .infin. | 79.903 |  |
| 10 | 164.908 | 52.350 | Quartz |
| 11 | −1246.141 | 27.586 |  |
| 12 | 280.226 | 19.580 | Quartz |
| 13 | 114.495 | 133.941 |  |
| 14 | .infin. | 365.253 |  |
| 15 | −216.480 | 12.551 | Quartz |
| 16 | −113.446 | 1.399 |  |
| 17 | −329.056 | 10.797 | Quartz |
| 18 | −552.687 | 60.000 |  |
| 19 | .infin. | .000 |  |

| Surface | Aspheric Constants |
|---|---|
| 7 | K = −.00640071 C1 = .347156E−07 C2 = .802432E−13 |
|   | C3 = −.769512E−17 C4 = .157667E−21 |
| 11 | K = +.00104108 C1 = .431697E−07 C2 = −.564977E−13 |
|   | C3 = −.125201E−16 C4 = .486357E−21 |
| 17 | K = +.00121471 C1 = −.991033E−07 C2 = −.130790E−11 |
|   | C3 = −.414621E−14 C4 = .200482E−17 C5 = −.392671E−21 |

TABLE 2

Lens Data for REMA Objective of FIG. 5
Scale Ratio: 4.730:1 Wavelength: 248.33 nm

|   | Radius | Thickness | Material |
|---|---|---|---|
| 501 | .infin. | 49.615 |  |
| 502 | −36.076 | 39.343 | Quartz |
| 503 | −58.772 | 7.280 |  |
| 504 | 769.933 | 46.491 | Quartz |
| 505 | −154.827 | 24.882 |  |
| 506 | 251.853 | 42.379 | Quartz |
| 507 | −5038.206 | 177.092 |  |
| 508 | 1206.092 | 26.134 | Quartz |
| 509 | −382.601 | 2.521 |  |
| 510 | Diaphragm | 16.000 |  |
| 511 | .infin. | 48.808 |  |
| 512 | 220.678 | 54.515 | Quartz |
| 513 | −329.344 | 23.787 |  |
| 514 | −2544.603 | 12.265 | Quartz |
| 515 | 107.244 | 178.887 |  |
| 516 | .infin. | 312.788 |  |
| 517 | −634.092 | 24.232 | Quartz |
| 518 | −177.052 | 24.158 |  |
| 519 | −1168.238 | 15.641 | Quartz |
| 520 | −3520.690 | 9.182 |  |
| 521 | .infin. | 4.000 | Quartz |
| 522 | .infin. | 60.000 |  |
| 523 | .infin. | .000 |  |

TABLE 2-continued

Lens Data for REMA Objective of FIG. 5
Scale Ratio: 4.730:1 Wavelength: 248.33 nm

| Surface | Aspheric Constants |
|---|---|
| 505 | K = −.11512040 C1 = .36489383E−07 C2 = .16169445E−11 |
|   | C3 = −.70228033E−16 C4 = .36695356E−20 |
| 509 | K = −.01464591 C1 = .37060030E−07 C2 = .92577260E−12 |
|   | C3 = −.10037407E−16 C4 = .29843433E−20 |
| 514 | K = +.00003903 C1 = −.13705523E−08 C2 = −.90824867E−12 |
|   | C3 = .81297785E−16 C4 = −.56418498E−20 |
| 520 | K = −.000150010 C1 = .17085177E−07 C2 = .18373060E−10 |
|   | C3 = −.49871601E−14 C4 = .61193181E−18 |
|   | C5 = −.23186913E−22 |

Figure 6:
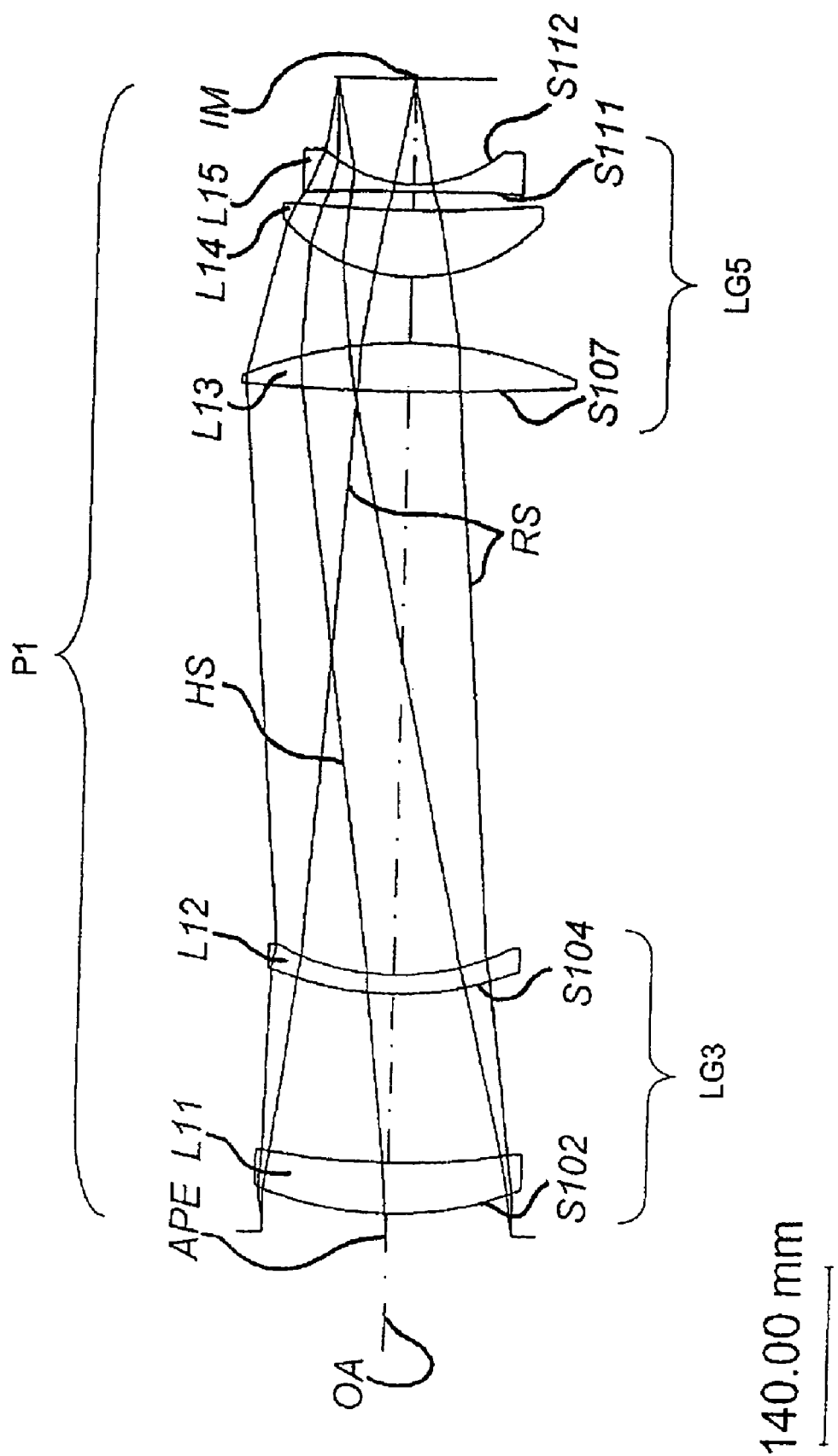
FIG. 6 shows the lens section of a partial objective according to the invention.

The lens section of a partial objective P1 according to the invention is shown in FIG. 6. Besides the lenses, the marginal rays RS of the middle ray bundle, and also the outermost chief ray HS and the rays bounding the ray bundle of the outermost chief ray, are drawn in. The partial objective P1 is constructed with rotational symmetry about the optical axis OA. The system data are set out in Table 3. As the lens material, quartz ($SiO_2$) is used in this embodiment; it has a refractive index of 1.5603 at the working wavelength $\lambda$=193.3 nm. Fluoride crystals can also be used as the lens material when the transmission is to be increased or the partial objective is to be used at wavelengths of 157 nm or 126 nm. With the partial objective P1, an image field of diameter 116.0 mm is illuminated in the image plane IM. The image-side numerical aperture is 0.18. The partial objective thus has an etendue value of 20.7 mm.

TABLE 3

Optical Data for the Partial Objective of FIG. 1

| Lens | Surface | Radius (mm) | Thickness | Material | Diameter (mm) |
|---|---|---|---|---|---|
|   | APE | 0.00 | 15.59 |  | 187.9 |
| L11 | S102 | 260.32 | 39.87 | SiO2 | 195.5 |
|   | S103 | 567.25 | 135.51 |  | 191.1 |
| L12 | S104 | 234.09 | 15.00 | SiO2 | 184.3 |
|   | S105 | 180.39 | 259.04 |  | 178.1 |
|   | S106 | 0.00 | 206.08 |  | 213.7 |
| L13 | S107 | 1539.49 | 38.23 | SiO2 | 245.5 |
|   | S108 | −306.69 | 52.29 |  | 245.8 |
| L14 | S109 | 130.37 | 52.39 | SiO2 | 190.4 |
|   | S110 | 844.68 | 15.14 |  | 175.2 |
| L15 | S111 | 555.42 | 5.86 | SiO2 | 160.8 |
|   | S112 | 100.69 | 79.74 |  | 134.3 |
|   | IM | 0.00 | 0.00 |  | 116.0 |

Z: Sag; h: Height; R: Radius; EX: Eccentricity;

Ck: Aspheric constants $$z = \frac{h^2/R}{1 + \sqrt{1 - (1 - EX)\frac{h^2}{R^2}}} + C_1 h^4 + C_2 h^6 + \ldots$$

| Surface | EX | C1 | C2 | C3 | C4 |
|---|---|---|---|---|---|
| S102 | −0.613 | −9.1133E−09 | 1.0931E−12 | −1.1885E−16 | 4.3105E−21 |
| S104 | 3.5118 | 2.6731E−08 | −1.1221E−12 | 7.9601E−17 | −4.1294E−21 |
| S111 | 2.0197E+12 | −5.5586E−08 | 4.3580E−12 | −1.9413E−16 | 2.3919E−21 |

Parallel pencils of rays enter the partial objective through the aperture plane APE, with a diameter of 187.9 mm, and are focused to a respective spot in the image plane IM. For all image points within the image field, the maximum spot diameter is 160 µm. The size of the spot diameter is determined by the correction of the field imaging and in particular by the correction of the field curvature and the spherical aberration.

Figure 7:
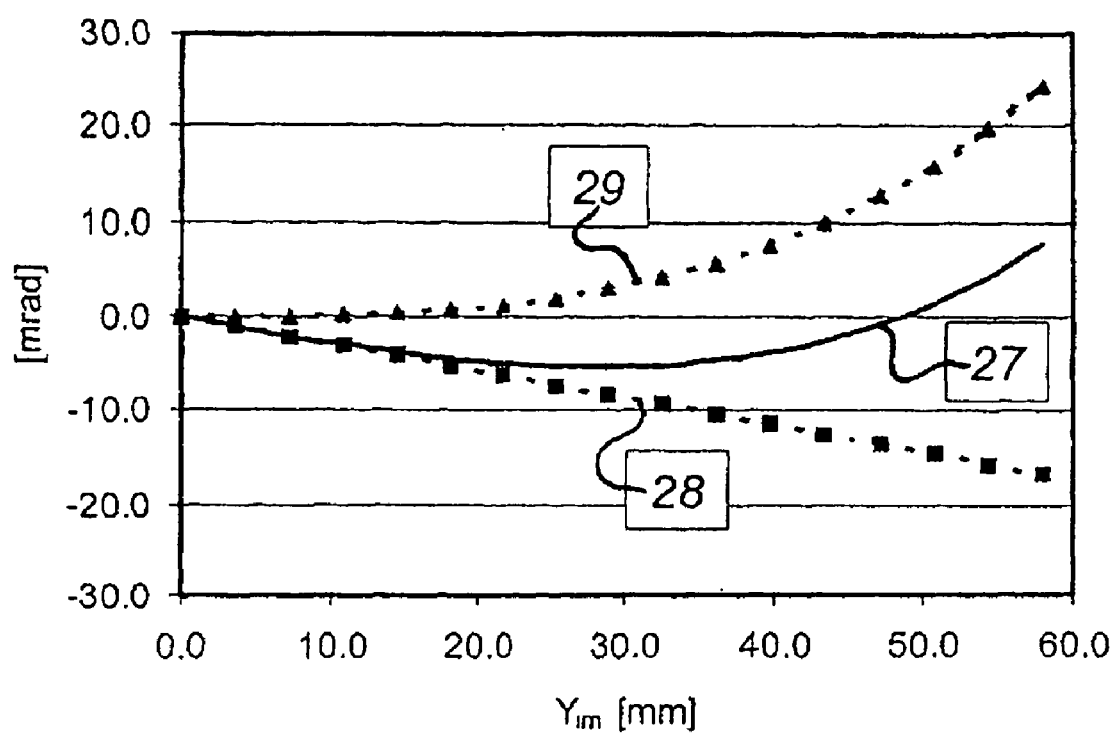
FIG. 7 shows a diagram of the pupil function of the partial objective of FIG. 6.

The chief rays of the pencils of rays intersect the optical axis OA in the center of the aperture plane APE on entry into the partial objective P1 of FIG. 6. The angle of a chief ray in the aperture plane APE with respect to the optical axis then is related to the field height $Y_{im}$ of the chief ray in the image plane IM. The maximum angle of a chief ray in the aperture plane APE is 6.3° and corresponds in the image plane IM to a field height $Y_{im}^{max}$ of 58.0 mm. The focal length of the partial objective P1 is 487.7 mm. The pupil function $PF(Y_{im})$ of the partial objective P1, which gives the angular distribution of the chief rays in the image plane, is shown in FIG. 7 as the full line 27. The chief ray angles for the positive field heights have values in the range of −5.3 mrad through +7.9 mrad, so that the chief rays for positive field heights run on average nearly parallel to the optical axis. The pupil function can be developed from the polynomial series according to Equation (1), the coefficients of which can be read from Table 4. The coefficient c1 of first order corresponds here to the slope of the pupil function at $Y_{im}$=0 mm and gives the paraxial position of the exit pupil, or the position of the exit pupil for aberration-free pupil imaging. The coefficients of the third and higher orders describe the spherical aberration of pupil imaging. In FIG. 7, the linear contribution to the pupil function is drawn as a dashed line 28 marked by squares, and the non-linear contribution is drawn as a dashed line 29 marked by triangles.

TABLE 4

Coefficients of the Polynomial Series

| Coefficient | | Polynomial Contributions with $Y_{im}^{max}$ = 58.0 mm |
|---|---|---|
| $c_1$ | −2.8566E−01 mrad/mm | −16.60 mrad |
| $c_3$ | 1.2526E−04 mrad/mm³ | 24.57 mrad |
| $c_5$ | −3.9215E−09 mrad/mm⁵ | −2.60 mrad |
| $c_7$ | 6.4435E−13 mrad/mm⁷ | 1.44 mrad |
| $c_9$ | 1.5273E−16 mrad/mm⁹ | 1.15 mrad |

The polynomial contributions $c_n \cdot Y_{im}^n$ are given in the third column of Table 4 which result for the respective order n for the maximum positive field height $Y_{im}^{max}$=+58.0 mm. The largest contribution to the spherical aberration for pupil imaging is the contribution of third order, +24.6 mrad, for the maximum positive field height $Y_{im}^{max}$. The total non-linear contribution is +24.6 mrad. Since the non-linear contribution for the positive field height has a positive sign, the spherical aberration is clearly overcorrected. The ratio of the non-linear contribution to the linear contribution for the maximum field height $Y_{im}^{max}$ is −1.48.

The partial objective P1 is constructed from a first lens group LG3 and a second lens group LG5. The first lens group LG3 consists of the lens L11 with positive refractive power and the lens L12 with negative refractive power. Within the first lens group LG3, the outermost chief ray HS runs between the optical axis OA and the marginal ray RS of the central ray bundle. The lenses L11 and L12 have the aspheric lens surfaces S102 and S104. The lenses L11 and L12 are both meniscuses, with the convex lens surface facing toward the aperture plane APE. The first lens group LG3 chiefly contributes to the correction of field imaging and thus to minimization of the spot diameter in the image plane IM.

In the lenses of the second lens group LG5, the marginal ray RS of the central ray bundle runs between the optical axis OA and the outermost chief ray HS. There is sufficient constructional space between the first lens group LG3 and the second lens group LG5 for the installation of a deflecting mirror. The illuminating beam path can be deflected by the deflecting mirror through 90°, for example. Alternatively, it is also possible to install a beamsplitter, in order to couple out a portion of the illuminating light for measurement purposes. If a polarizing beamsplitter cube is used, light from two optical channels can be superposed nearly loss-free. For this purpose, the beamsplitter coating of the beamsplitter cube for 45° deflection is designed such that light which is polarized perpendicularly to the plane of incidence is nearly completely reflected, while light which is polarized parallel to the incidence surface is nearly completely transmitted. This arrangement is described in more detail in the embodiment of FIG. 12.

The second lens group LG5 in FIG. 6 acts as a field lens, which mainly affects the pupil imaging. Furthermore, it makes it possible to correct the distortion in field imaging, so that the intensity distribution in the image plane IM can be corrected and matched. In order to fulfill these requirements, the second lens group LG5 is constructed from the biconvex lens L13 with positive refractive power, the meniscus L14 with positive refractive power, and the lens L15 with negative refractive power. The lens surface S111 is an aspheric lens surface, the surface description of which is given in Table 3. The radius of the envelope sphere, which intersects the aspheric lens surface S111 at the vertex and at the edge of the illuminated region at 80.4 mm, is −2218.4 mm, so that the maximum sag difference between the aspheric lens surface S111 and the envelope sphere is 0.28 mm.

The lens L15 with negative refractive power has a lens surface S112 which is concave to the image plane, the ratio of radius of curvature to lens diameter being 0.75. The lens L15 is, in the direction of light propagation, the last lens with refractive power before the image plane IM, so that the concave lens surface S112 is arranged immediately before the image plane IM. The free working distance between the last lens L15 and the image plane IM is 50.0 mm. The free working distance describes a region along the optical axis OA in which no optical elements of the partial objective are situated. There is, however, the possibility of installing a plane-parallel closure plate or intensity filter after the lens L15; however, these only lead to a displacement of the image plane IM of the partial objective P1.

The partial objective P1 is usually utilized immediately before the reticle in an illuminating device of a microlithographic projection exposure apparatus. Since the reticle reflects back a portion of the incident light into the partial objective P1, the lenses of the second lens group LG5 are advantageously designed so that undesired reflections are minimized; this is attained in that the light reflected at the reticle is reflected a second time at a lens surface and returns to the reticle. The minimization of the undesired reflections is attained in that the partial objective P1 is designed so that the outermost chief ray HS intersects the image plane IM far outside the optical axis after double reflection at the reticle and at a lens surface. For the lens surfaces S107 and S112, the doubly reflected chief ray HS returns to the image plane IM, while for undesired reflections between the image plane and the lens surfaces S108, S109, S110 and S111, the outermost chief ray no longer reaches the image plane at all, but strikes the mount of the partial objective P1. For undesired reflections between the image plane and the lens surface S107, the outermost chief ray intersects the image plane at a height of 37.3 mm, which corresponds to a height ratio of 64.3% with respect to the maximum field height $Y_{im}^{max}$. For undesired reflections between the image plane and the lens surface S112, the outermost chief ray intersects the image plane at a height of 107.7 mm, which corresponds to a height ratio of 185.7% with respect to the maximum field height $Y_{im}^{max}$, so that the doubly reflected chief ray strikes the image plane IM outside the image field.

The lens surface S112, concave to the image plane IM, is critical for undesired reflections when no further lenses with refractive power follow the lens L15. If the distance of the image plane IM from the vertex of the lens surface S112 were equal to half the radius of curvature of the lens surface S112, the light reflected back from the object to be illuminated into the image plane IM would be focused in the image plane IM when the image plane IM is illuminated nearly telecentrically, as in the present case. The concave lens surface S112 has, on the contrary, a radius of curvature of 100.7 mm and a distance from the image plane IM of 79.7 mm, so that the focal plane of the concave lens surface S112, which functions as a mirror as regards the calculation of the undesired reflections, has a distance of 29.4 mm to the image plane IM. The ratio of this distance to half the radius of curvature is 0.6, so that a possible undesired reflection has only an insignificant effect.

So that the central ray bundle strikes the concave lens surface S112 at small angles of incidence and thus little aberration for field imaging is introduced, the concave lens surface S112 is arranged as concentrically of the image plane IM as possible. The ratio of the distance of the image plane IM from the vertex of the concave lens surface S112 to the absolute value of the radius of curvature of the concave lens surface S112 is 0.79.

Figure 8:
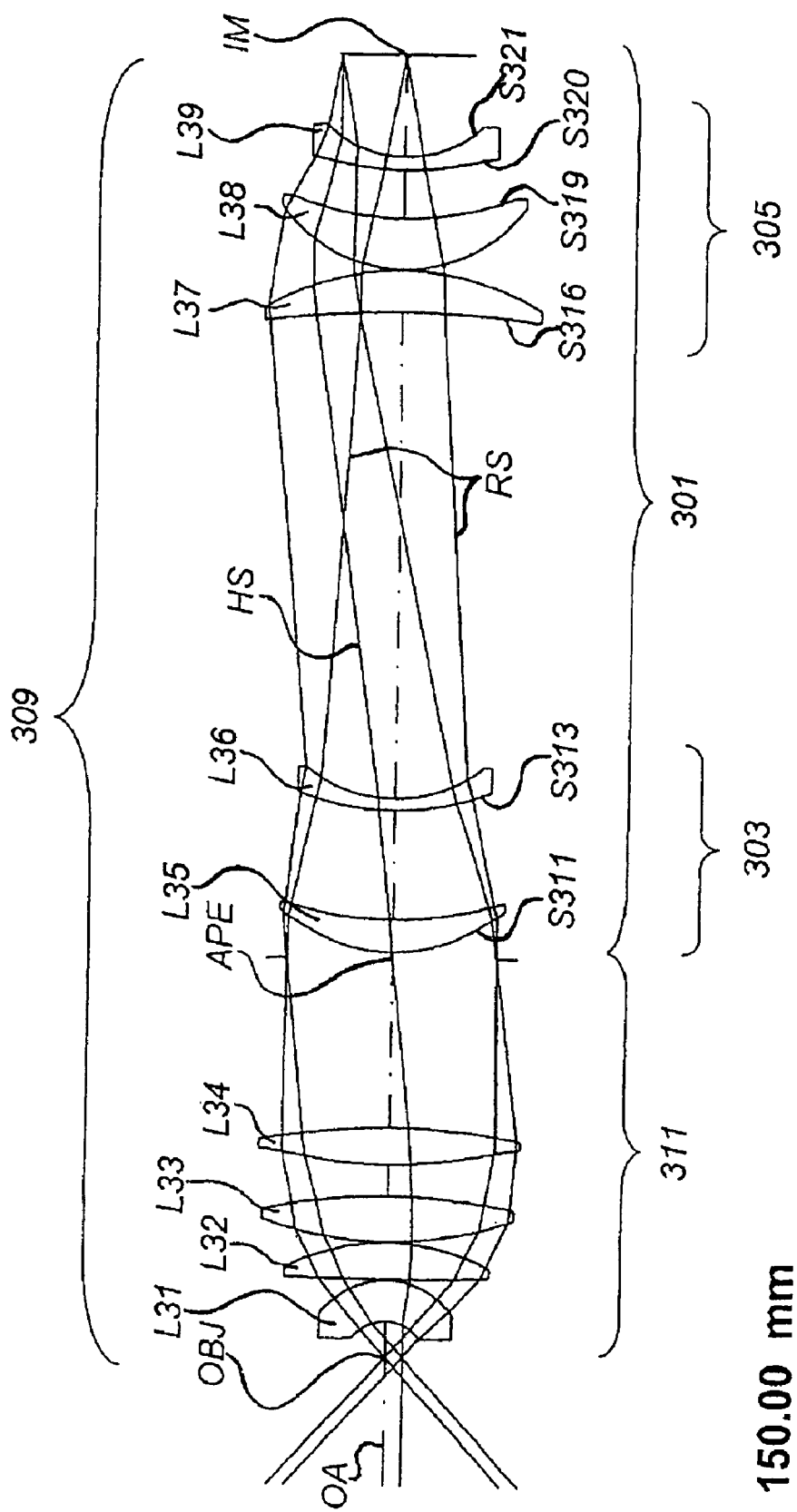
FIG. 8 shows the lens section of a third embodiment of a REMA objective.

The lens section of a third embodiment of a REMA objective 309 is shown in FIG. 8. Besides the lenses, there are drawn in the marginal rays RS of the central ray bundle and also the outermost chief ray HS and the rays bounding the ray pencil of the outermost chief ray HS. The REMA objective 309 is here constructed with rotational symmetry about the optical axis OA. The system data are set out in Table 5. In this embodiment, calcium fluoride crystal ($CaF_2$) and quartz ($SiO_2$) are used as lens materials, and have respective refractive indices of 1.5014 and 1.5603 at the working wavelength of $\lambda=193.3$ nm. The elements of FIG. 8 corresponding to elements of FIG. 6 have the same reference numbers as in FIG. 6, increased by the number 300. Reference is made to the description of FIG. 6 for a description of these elements.

TABLE 5

Optical Data for the Partial Objective of FIG. 8

| Lens | Surface | Radius (mm) | Thickness (mm) | Material | Diameter (mm) |
|---|---|---|---|---|---|
|  | OBJ | 0.00 | 32.95 |  | 31.2 |
| L31 | S302 | −38.69 | 37.88 | CaF2 | 61.9 |
|  | S303 | −73.41 | 0.90 |  | 114.4 |
| L32 | S304 | 2696.07 | 33.32 | CaF2 | 168.2 |
|  | S305 | −191.13 | 0.90 |  | 178.0 |
| L33 | S306 | 329.78 | 41.98 | SiO2 | 216.0 |
|  | S307 | −514.77 | 28.53 |  | 219.1 |
| L34 | S308 | 334.07 | 34.03 | SiO2 | 227.6 |
|  | S309 | −570.33 | 161.49 |  | 227.6 |
|  | APE | 0.00 | 6.00 |  | 188.0 |
| L35 | S311 | 130.20 | 30.35 | SiO2 | 195.8 |
|  | S312 | 324.12 | 99.95 |  | 192.5 |
| L36 | S313 | 211.39 | 11.40 | SiO2 | 168.8 |
|  | S314 | 127.10 | 230.32 |  | 158.8 |
|  | S315 | 0.00 | 216.90 |  | 197.4 |
| L37 | S316 | −851.36 | 37.33 | SiO2 | 237.1 |
|  | S317 | −237.99 | 0.90 |  | 240.0 |
| L38 | S318 | 133.05 | 46.59 | SiO2 | 212.7 |
|  | S319 | 275.70 | 42.03 |  | 200.4 |
| L39 | S320 | 240.69 | 12.00 | SiO2 | 162.1 |
|  | S321 | 101.80 | 91.62 |  | 138.5 |
|  | IM | 0.00 | 0.00 |  | 116.2 |

Z: Sag; h: Height; R: Radius; EX: Eccentricity;

Ck: Aspheric constants $$z = \frac{h^2/R}{1+\sqrt{1-(1-EX)\frac{h^2}{R^2}}} + C_1 h^4 + C_2 h^6 + \ldots$$

| Surface | EX | C1 | C2 | C3 | C4 |
|---|---|---|---|---|---|
| S308 | −2.4978 | −4.3481E−08 | −7.8594E−14 | −2.0935E−17 | 8.6082E−23 |
| S311 | 0.2840 | −4.1616E−08 | −1.1523E−12 | −4.8136E−18 | −5.8384E−21 |
| S313 | 0.6222 | −3.5043E−08 | 1.0875E−12 | 2.1557E−16 | −3.6907E−21 |
| S320 | 0.9715 | −5.9896E−04 | −2.8284E−12 | 1.2407E−16 | 2.9936E−21 |

The REMA objective 309 of FIG. 8 images an object field with a magnification ratio of $\beta=-3.74$ onto an image field. It consists of a first partial objective 311, and a second partial objective 301 whose construction is similar to that of the partial objective P1 of FIG. 6. An image field with a diameter of 116.2 mm is illuminated in the image plane IM by the REMA objective 309. The image-side numerical aperture is 0.18. The REMA objective 309 thus has an etendue value of 20.9 mm. The entrance pupil of the REMA objective 309 is situated at infinity, so that the chief rays run parallel to the optical axis OA in the object plane OBJ. The pupil imaging of the first partial objective 311 is corrected as well as possible. Nevertheless, because of the spherical aberration introduced by the first partial objective 311 and the field curvature of the pupil imaging, the chief rays do not intersect the optical axis OA directly in the aperture plane APE, but with an axial displacement, dependent on the object height, with respect to the aperture plane APE. In the REMA objective 309 of FIG. 8, the intersection points of the chief rays with the optical axis OA are situated in an axial region of 5.4 mm. This corresponds to 2.9% of the aperture diaphragm diameter, which is 188 mm.

The pencils of rays starting from the object plane OBJ are each focused to a spot in the image plane IM. Within the image field, the maximum diameter of the spot images is 240 μm for all image points.

The pupil function of the REMA objective 309 can be developed as a polynomial series according to Equation (1), with the coefficients given in Table 6.

TABLE 6

Coefficients of the Polynomial Series

| Coefficient | | Polynomial Contributions with $Y_{im}^{max} = 58.1$ mm |
|---|---|---|
| $c_1$ | −2.8278E−01 mrad/mm | −16.43 mrad |
| $c_3$ | 1.0607E−04 mrad/mm$^3$ | 20.08 mrad |
| $c_5$ | 6.5595E−09 mrad/mm$^5$ | 4.34 mrad |
| $c_7$ | −7.5251E−13 mrad/mm$^7$ | −1.68 mrad |
| $c_9$ | 7.9719E−17 mrad/mm$^9$ | 0.60 mrad |

It can be seen from Table 6 that the greatest contribution to the spherical aberration of pupil imaging for the maximum positive field height $Y_{im}^{max}$ is the third order contribution of +20.1 mrad. The total non-linear contribution is +24.1 mrad, so that the spherical aberration is clearly overcorrected. The ratio of non-linear contribution to linear contribution for the maximum field height $Y_{im}^{max}$ is −1.46.

The second partial objective 301 is constructed from the first lens group 303 and the second lens group 305. The lenses L35 and L36 are to be counted as part of the first lens group 303, lens L35 being a meniscus with positive refractive power and lens L36 a meniscus with negative refractive power. The convex surface of the meniscuses respectively faces toward the aperture plane APE. The lenses of the first group 303 have a respective aspheric lens surface S311 and S313.

The second lens group 305 of the second partial objective 301 is constructed from the meniscus L37 with positive refractive power, having its convex lens surface facing toward the image plane IM; the meniscus L38 with positive refractive power, having its convex lens surface facing toward the aperture plane APE; and the meniscus L39 with negative refractive power, having its convex lens surface facing toward the aperture plane APE. The lens surface S320 is an aspheric lens surface, the surface description of which is given in Table 5. The radius of the envelope sphere, which intersects the aspheric lens surface S320 at the vertex, and at the edge of the illuminated region at 81.1 mm, is 317.1 mm, so that the maximum sag difference between the aspheric lens surface S320 and the envelope sphere is 0.87 mm.

The lens L39 with negative refractive power has a lens surface S321 concave toward the image plane IM, the ratio of the radius of curvature to the lens diameter being 0.74. The lens L39 is the last lens having refractive power before the image plane IM, so that the concave lens surface S321 is arranged immediately before the image plane IM. The free working distance between the last lens L39 and the image plane IM is 64.8 mm.

Since the reticle is arranged in the image plane IM of the REMA objective 309, the lenses of the second lens group 305 of the second partial objective 301 have to be optimized as regards minimizing the undesired reflections which can be formed between the partially reflecting reticle and the lens surfaces subject to residual reflections. The lens surfaces S316, S319, S320 and S321 are critical for undesired reflections, while for the lens surfaces S317 and S318, the outermost chief ray HS reflected at the reticle and at the said lens surfaces no longer reaches the image plane but strikes the objective mount, still within the REMA objective 309. For undesired reflections between the image plane IM and the lens surface S316, the doubly reflected chief ray HS intersects the image plane IM at a height of 41.9 mm, which corresponds to a height ratio of 72% with respect to the maximum field height $Y_{im}^{max}$. For undesired reflections between the image plane IM and the lens surface S319, the doubly reflected chief ray HS intersects the image plane IM at a height of 59.8 mm, which corresponds to a height ratio of 102.9% with respect to the maximum field height $Y_{im}^{max}$. For undesired reflections between the image plane IM and the lens surface S320, the doubly reflected chief ray HS intersects the image plane IM at a height of 83.3 mm, which corresponds to a height ratio of 143.4% with respect to the maximum field height $Y_{im}^{max}$. For undesired reflections between the image plane IM and the lens surface S321, the doubly reflected chief ray HS intersects the image plane IM at a height of 158.8 mm, which corresponds to a height ratio of 273.3% with respect to the maximum field height $Y_{im}^{max}$.

The concave lens surface S321 has a radius of curvature of 101.80 mm and a distance from the image plane IM of 91.62 mm, so that the focal plane of the concave lens surface S321, which functions as a mirror as regards the calculation of undesired reflections, has a distance of 40.7 mm from the image plane IM. The ratio of this distance to half the radius of curvature is 0.8, so that a possible undesired reflection has only an insignificant effect.

So that the central ray bundle strikes the concave lens surface S321 at small angles of incidence and thus little aberration for field imaging is introduced, the concave lens surface S321 is arranged as concentrically of the image plane IM as possible. The ratio of the distance of the image plane IM from the vertex of the concave lens surface S321 to the absolute value of the radius of curvature of the concave lens surface S321 is 0.90.

Figure 9:
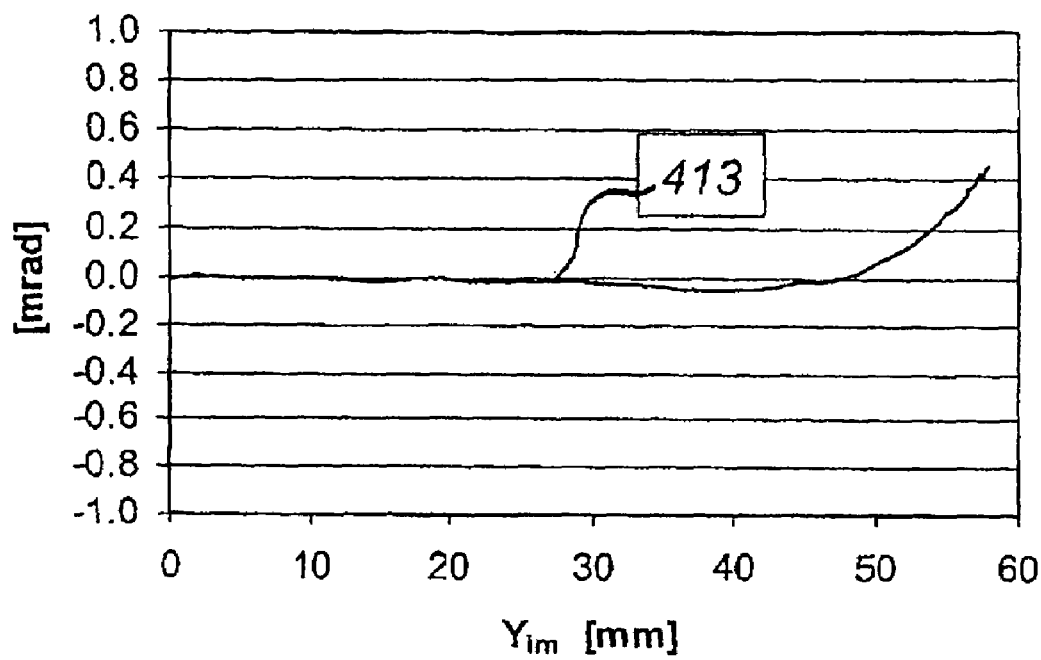
FIG. 9 shows a diagram of the deviation of the pupil function of the REMA objective of FIG. 8 from the distribution of the weighted average ray angles over the field height.

Due to the aberrations of field imaging of the REMA objective 309, the energy-weighted average ray for an image point do not coincide with the corresponding chief ray. While in the object plane OBJ the energy-weighted average ray and the chief ray coincide for each image point and run parallel to the optical axis OA, coma and oblique spherical aberration lead, for image points outside the optical axis OA, to a difference between the energy-weighted average ray and the chief ray. The direction of the energy-weighted average ray depends here on the extent of the pencils of rays in the aperture plane APE. If a ray bundle completely illuminates the aperture plane APE, a greater deviation of the energy-weighted average ray from the chief ray is to be expected, because of the greater coma, than for pencils of rays which illuminate the aperture plane APE only in a region around the optical axis OA. The coma contributions become extreme for an annular illumination of the aperture plane APE, since in this case the ray pencils have only the outer aperture rays. The coma and the oblique spherical aberration are corrected in the REMA objective 309 of FIG. 8, such that the deviation of the angles of the energy-weighted average rays from the chief ray angles, with complete illumination of the aperture plane, is smaller than ±0.5 mrad for all field heights. The angular deviation is shown in FIG. 9 as a full line for positive field heights.

Figure 10:
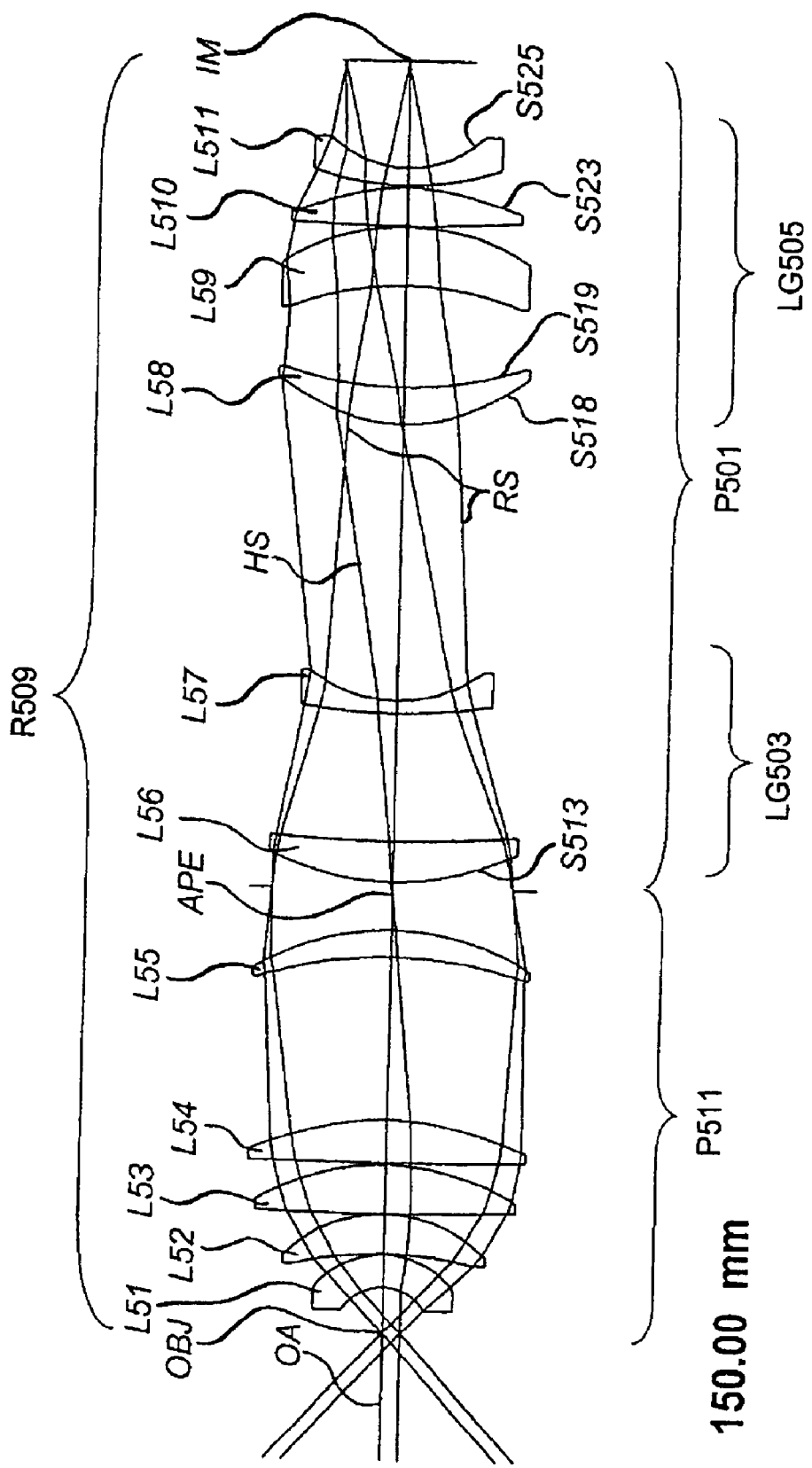
FIG. 10 shows a lens section of a fourth embodiment of a REMA objective.

The lens section of a fourth embodiment of a REMA objective 509 is shown in FIG. 10. Besides the lenses, there are drawn in the marginal rays RS of the central ray bundle and also the outermost chief ray HS and the rays bounding the ray pencil of the outermost chief ray HS. The REMA objective 509 is here constructed with rotational symmetry about the optical axis OA. The system data are set out in Table 7. In this embodiment, quartz (SiO$_2$) is used as the lens material, and has a refractive index of 1.5084 at the working wavelength of λ=248.3 nm. The elements of FIG. 10 corresponding to elements of FIG. 6 and FIG. 8 have the same reference numbers as in FIG. 6 or FIG. 8, increased respectively by the number 500, or 200. The description of FIG. 6 or FIG. 8 is referred to for a description of these elements.

TABLE 7

Optical Data for the Partial Objective of FIG. 10

| Lens | Surface | Radius (mm) | Thickness (mm) | Material | Diameter (mm) |
|---|---|---|---|---|---|
|  | OBJ | 0.00 | 44.12 |  | 32.4 |
| L51 | S502 | −42.28 | 30.35 | SiO2 | 73.0 |
|  | S503 | −78.14 | 0.90 |  | 121.7 |
| L52 | S504 | −338.66 | 37.30 | SiO2 | 163.1 |
|  | S505 | −124.59 | 0.86 |  | 177.2 |
| L53 | S506 | 2979.91 | 45.50 | SiO2 | 221.0 |
|  | S507 | −219.18 | 1.65 |  | 228.3 |
| L54 | S508 | 5302.65 | 40.00 | SiO2 | 241.5 |
|  | S509 | −230.16 | 156.30 |  | 244.0 |
| L55 | S510 | −377.28 | 26.00 | SiO2 | 241.3 |
|  | S511 | −224.20 | 40.60 |  | 243.4 |
|  | APE | 0.00 | 6.00 |  | 217.2 |
| L56 | S513 | 212.83 | 39.70 | SiO2 | 216.9 |
|  | S514 | 1296.09 | 120.30 |  | 211.7 |
| L57 | S515 | 523.30 | 11.70 | SiO2 | 166.8 |
|  | S516 | 128.28 | 148.73 |  | 155.8 |
|  | S517 | 0.00 | 113.55 |  | 233.3 |
| L58 | S518 | 146.29 | 33.90 | SiO2 | 219.7 |
|  | S519 | 345.28 | 94.30 |  | 216.2 |
| L59 | S520 | −268.89 | 55.00 | SiO2 | 208.1 |
|  | S521 | −200.89 | 0.80 |  | 216.3 |
| L510 | S522 | 1616.33 | 35.50 | SiO2 | 202.3 |
|  | S523 | −174.93 | 2.20 |  | 199.1 |
| L511 | S524 | 256.46 | 15.90 | SiO2 | 163.9 |
|  | S525 | 96.08 | 96.71 |  | 137.4 |
|  | IM | 0.00 | 0.00 |  | 113.3 |

Z: Sag; h: Height; R: Radius; EX: Eccentricity;

Ck: Aspheric constants $$z = \frac{h^2/R}{1 + \sqrt{1-(1-EX)\frac{h^2}{R^2}}} + C_1 h^4 + C_2 h^6 + \ldots$$

| Surface | EX | C1 | C2 | C3 | C4 | C5 |
|---|---|---|---|---|---|---|
| S509 | −1.1741 | 3.9084E−08 | 3.8630E−13 | 6.5586E−17 | −3.3899E−21 | 1.2432E−25 |
| S513 | −0.2501 | −2.1870E−08 | 5.4913E−14 | −7.7358E−17 | 4.1956E−21 | −1.2014E−25 |
| S518 | 0.2356 | −3.4023E−08 | −1.0405E−12 | 7.3414E−17 | −9.7841E−21 | 3.0608E−25 |
| S523 | −0.8321 | 1.4350E−07 | −4.9565E−12 | 5.7530E−16 | −3.6123E−20 | 1.5494E−24 |

The REMA objective R509 of FIG. 10 images an object field with a magnification ratio of β=−3.50 onto an image field. It consists of a first partial objective P511, and a second partial objective P501. An image field with a diameter of 113.3 mm is illuminated in the image plane IM by the REMA objective R509. The image-side numerical aperture is 0.19. The REMA objective R509 thus has an etendue value of 21.5 mm, which is greater still than the etendue value of the REMA objective 309 of FIG. 8. The entrance pupil of the REMA objective R509 is situated at infinity, so that the chief rays run parallel to the optical axis OA in the object plane OBJ. Due to the spherical aberration and field curvature of pupil imaging which are introduced by the first partial objective P511, the chief rays intersect the optical axis OA with an axial displacement with respect to the aperture plane APE. For the REMA objective R509 of FIG. 10, the intersection points of the chief rays with the optical axis OA are 8.2 mm apart. This distance corresponds to 3.8% of the aperture diaphragm diameter, which is 217.2 mm.

The pencils of rays starting from the object plane OBJ are each focused to a spot image in the image plane IM. Within the image field, the maximum diameter of the spot images is 260 μm for all image points.

The pupil function of the REMA objective R509 can be developed as a polynomial series according to Equation (1), with the coefficients given in Table 8.

TABLE 8

Coefficients of the Polynomial Series

| Coefficient | | Polynomial Contributions with $Y_{im}^{max}$ = 56.6 mm |
|---|---|---|
| $c_1$ | −5.341202E−01 mrad/mm | −30.23 mrad |
| $c_3$ | 2.526716E−04 mrad/mm$^3$ | 45.81 mrad |
| $c_5$ | −8.320880E−09 mrad/mm$^5$ | −4.83 mrad |
| $c_7$ | 2.120363E−12 mrad/mm$^7$ | 3.95 mrad |
| $c_9$ | −6.339048E−17 mrad/mm$^9$ | −0.38 mrad |

It can be seen from Table 8 that the greatest contribution to the spherical aberration in pupil imaging for the maximum positive field height $Y_{im}^{max}$ is the third order contribution of +45.8. The total non-linear contribution is +44.5 mrad, so that the spherical aberration is clearly overcorrected. The ratio of non-linear contribution to linear contribution for the maximum field height $Y_{im}^{max}$ is −1.47.

The second partial objective P501 of the REMA objective is constructed from a first lens group LG503 and a second lens group LG505. The lenses L56 and L57 are to be counted as part of the first lens group LG503, lens L56 being a meniscus with positive refractive power and lens L57 a meniscus with negative refractive power. The convex surfaces of the meniscuses respectively face toward the aperture plane APE. The lens L56 has an aspheric lens surface S513.

The second lens group LG505 of the second partial objective is constructed from the meniscus L58 with positive refractive power, having its convex lens surface facing toward the aperture plane APE; the meniscus L59 with positive refractive power, having its convex lens surface facing toward the image plane IM; the biconvex lens L510 with positive refractive power; and the meniscus L511 with negative refractive power, having its convex surface facing toward the aperture plane APE. The lens surface S523 is an aspheric lens surface, the surface description of which is given in Table 7. The radius of the envelope sphere, which intersects the aspheric lens surface S523 at the vertex and at the edge of the illuminated region of the aspheric lens surface S523 at 99.6 mm, is −238.6 mm, so that the maximum sag difference between the aspheric lens surface S523 and the envelope sphere is −1.61 mm. The second lens group LG505 contains a further aspheric lens surface S518, in order to be able to provide the large overcorrection of the spherical aberration of pupil imaging. The radius of the envelope sphere, which intersects the aspheric lens surface S518 at the vertex and at the edge of the illuminated region of the aspheric lens surface at 109.9 mm, is 170.1 mm, so that the maximum sag difference between the aspheric lens surface S518 and the envelope sphere is 1.66 mm.

The lens L511 has a lens surface S525 concave toward the image plane IM, the ratio of the radius of curvature to the lens diameter being 0.70. The lens L511 with negative refractive power is the last lens having refractive power before the image plane IM, so that the concave lens surface S525 is arranged immediately before the image plane IM. The free working distance between the last lens and the image plane IM is 67.9 mm.

The lenses of the second lens group LG505 of the second partial objective P501 have to be optimized as regards minimizing the undesired reflections. The lens surfaces S519, S522, S524 and S525 are critical for undesired reflections in the REMA objective R509 of FIG. 10, while for the lens surfaces S518, S520, S521 and S523, the outermost chief ray HS reflected at the reticle and at the said lens surfaces no longer reaches the image plane. For undesired reflections between the image plane IM and the lens surface S519, the outermost chief ray HS intersects the image plane IM at a height of 40.1 mm, which corresponds to a height ratio of 70.9% with respect to the maximum field height $Y_{im}^{max}$ of 56.6 mm. For undesired reflections between the image plane IM and the lens surface S522, the outermost chief ray HS intersects the image plane IM at a height of 58.6 mm, which corresponds to a height ratio of 103.5% with respect to the maximum field height $Y_{im}^{max}$. For undesired reflections between the image plane IM and the lens surface S524, the outermost chief ray HS intersects the image plane IM at a height of 52.4 mm, which corresponds to a height ratio of 92.6% with respect to the maximum field height $Y_{im}^{max}$. For undesired reflections between the image plane IM and the lens surface S525, the outermost chief ray HS intersects the image plane IM at a height of 180.7 mm, which corresponds to a height ratio of 319.3% with respect to the maximum field height $Y_{im}^{max}$.

The concave lens surface S525 has a radius of curvature of 96.08 mm and a distance from the image plane IM of 96.71 mm, so that the focal plane of the concave lens surface S525, which functions as a mirror as regards the calculation of undesired reflections, has a distance of 48.7 mm from the image plane IM. The ratio of this distance to half the radius of curvature is 1.0, so that a possible undesired reflection has only an insignificant effect.

So that the central ray bundle strikes the concave lens surface S521 at small angles of incidence and thus little aberration for field imaging is introduced, the concave lens surface S521 is arranged as concentrically of the image plane IM as possible. The ratio of the distance of the image plane IM from the vertex of the concave lens surface S521 to the absolute value of the radius of curvature of the concave lens surface S521 is 1.01.

Figure 11:
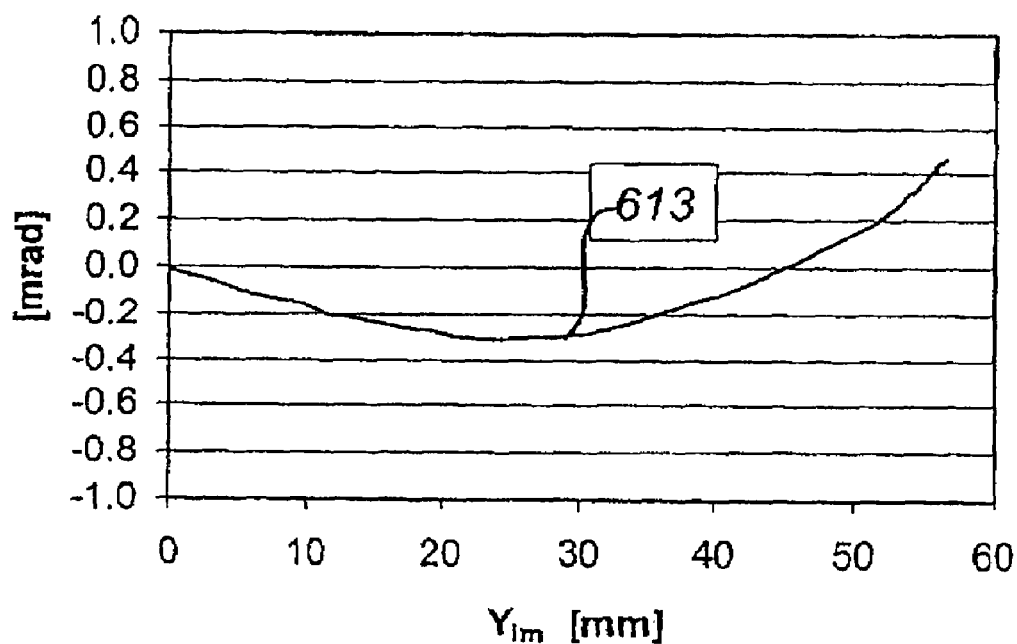
FIG. 11 shows a diagram of the deviation of the pupil function of the REMA objective of FIG. 10 from the distribution of the weighted average ray angles over the field height.

The angular deviation between the energy-weighted average rays and the chief rays for the REMA objective R509 of FIG. 10 is shown as the full line 613 in FIG. 11 for positive field heights. It is smaller than ±0.5 mrad for all field heights.

Figure 12:
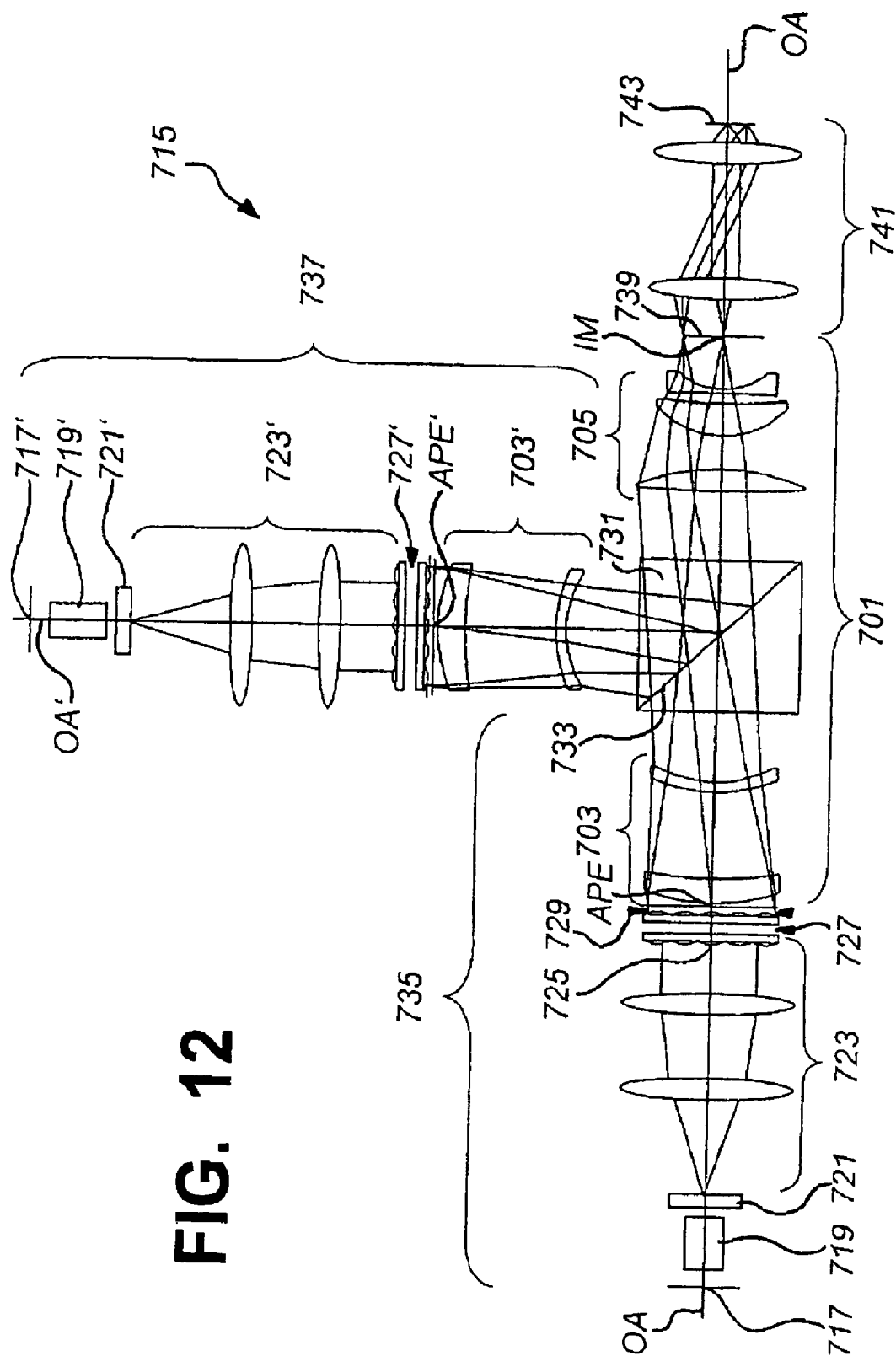
FIG. 12 shows a second embodiment of a microlithographic projection exposure apparatus with a partial objective according to the invention, in a schematic diagram.

FIG. 12 is a schematic diagram of a second embodiment of a microlithographic projection exposure apparatus 715, which in this case has two light sources 717 and 717'. A DUV or VUV laser, inter alia, can be used as the light source 717: for example, an ArF laser for 193 nm, a $F_2$ laser for 157 nm, an $Ar_2$ laser for 126 nm, and a NeF laser for 109 nm. A parallel light bundle is formed by a beam forming optics 719, and is incident on a divergence-increasing optical element 721. A raster plate of diffractive or refractive raster elements can be used, for example, as the divergence-increasing optical element 721. Each raster element produces a ray bundle, the angular distribution of which is determined by the extent and focal length of the raster element. The raster plate is situated in or near to the object plane of a following objective 723. The pencils of rays produced by the raster elements are superposed in the aperture plane 725 of the objective 723. The objective 723 can be designed as a zoom objective, in order to vary the extent of the illumination of the aperture plane 725. An annular illumination with variable ring width can also be produced by the use of two axicon lenses, which are displaceable along the optical axis, immediately before the aperture plane 725. Such a zoom axicon lens is known from DE 44 41 947 A (U.S. Pat. No. 5,675,401). The illumination can also be varied by exchanging the aperture-producing element 721. Special aperture-producing elements also permit the so-called quadrupole illumination with four separate regions. The aperture plane 725 of the objective 723 is the entry plane of a fly's eye condensor 727. A aperture plane APE of the whole illuminating system is situated in the neighborhood of the exit plane of the fly's eye condensor 727. The illumination can additionally be controlled in the aperture plane APE by means of masks 729 or transmission filters. The partial objective 701 of FIG. 6 follows the fly's eye condensor. The elements in FIG. 12 corresponding to elements of FIG. 6 have the same reference numbers as in FIG. 6, increased by the number 700. Reference is made to the description of FIG. 6 for a description of these elements. A polarizing beamsplitter cube 731 is situated between the first lens group 703 and the second lens group 705 of the partial objective 701, and superposes the beam paths starting from the light sources 717 and 717'. Thus all the components of the illuminating device up to the beamsplitter cube 731 are present twice over. The components of the second system branch 737 up to the beamsplitter cube 731 have dashed reference numbers in comparison with the first system branch 735. In order for the superposition to take place as free from loss as possible, the light which is to be transmitted at the beamsplitter surface 733 must be polarized in the plane of incidence, while the light which is to be reflected at the beamsplitter surface 733 must be polarized perpendicularly to the plane of incidence. This can be attained in that polarization-rotating means or polarization-selective means, such as polarization filters or λ/4 plates, are installed in the aperture plane APE. If the light source 717 already produces linearly polarized light, the state of polarization can be correspondingly set by alignment of the light source 717. The reticle 739 is situated in the image plane IM of the partial objective, and is imaged by a projection objective 741 onto the wafer 743. Both the reticle 739 and also the wafer 743 are situated on a respective holder device (not shown). This holder device permits the reticle 739 and the wafer 743 to be exchanged. In so-called scanner systems, the reticle 739 and the wafer 743 are moved in the scanning direction in proportion to the magnification ratio of the projection objective 741.

Figure 13:
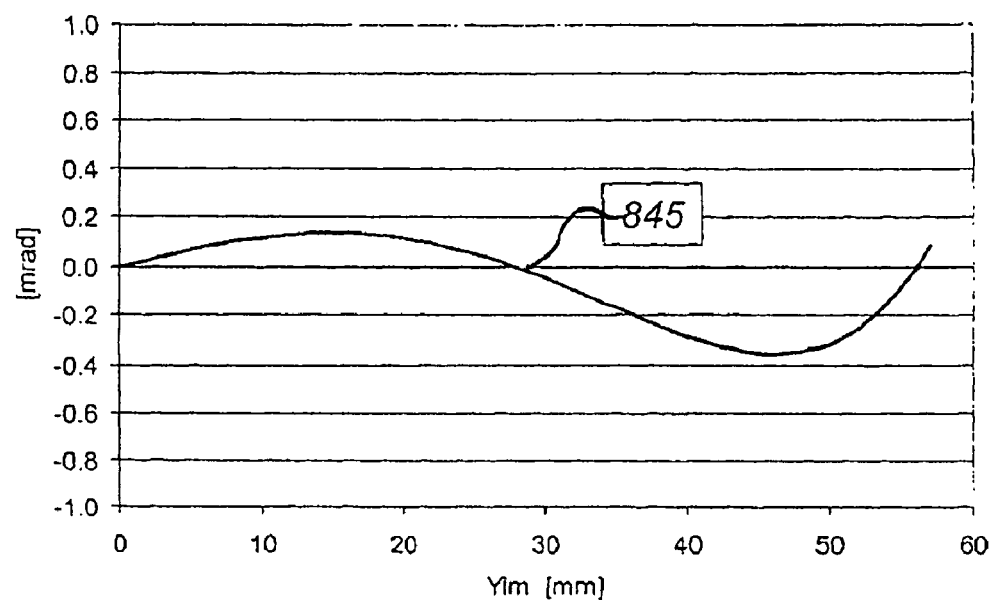
FIG. 13 shows a diagram of the deviation of the pupil function of the REMA objective of FIG. 8 from the object-side objective pupil function of a projection objective according to FIG. 2 of DE 19942281.8 (U.S. 2002/149855)

The projection objective of FIG. 7 of U.S. Ser. No. 09/760,066 (U.S. 2002/0149855 A1), which has a magnification ratio of −0.25, can be used as the projection objective shown only schematically in FIG. 12. The system data for this projection objective are given in Table 3 of DE 199 42 281.8 (U.S. 2002/0149855 A1), the distance between the object plane and the vertex of the lens L101 being 49.2885 mm. The pupil function of the partial objective 701 of FIG. 1, the system data of which are given in Table 3 of the present Application, is exactly matched to the distribution of the objective chief ray angles of the projection objective 741. FIG. 13 shows the deviation of the pupil function of the partial objective 701 from the distribution of the objective chief ray angles as a full line 845. The maximum deviation is ±0.4 mrad. By the matching of the partial objective 701 to the projection objective 741, it is possible to permit a considerable undercorrection of the spherical aberration of the pupil aberration in the projection objective 741.

Figure 14:
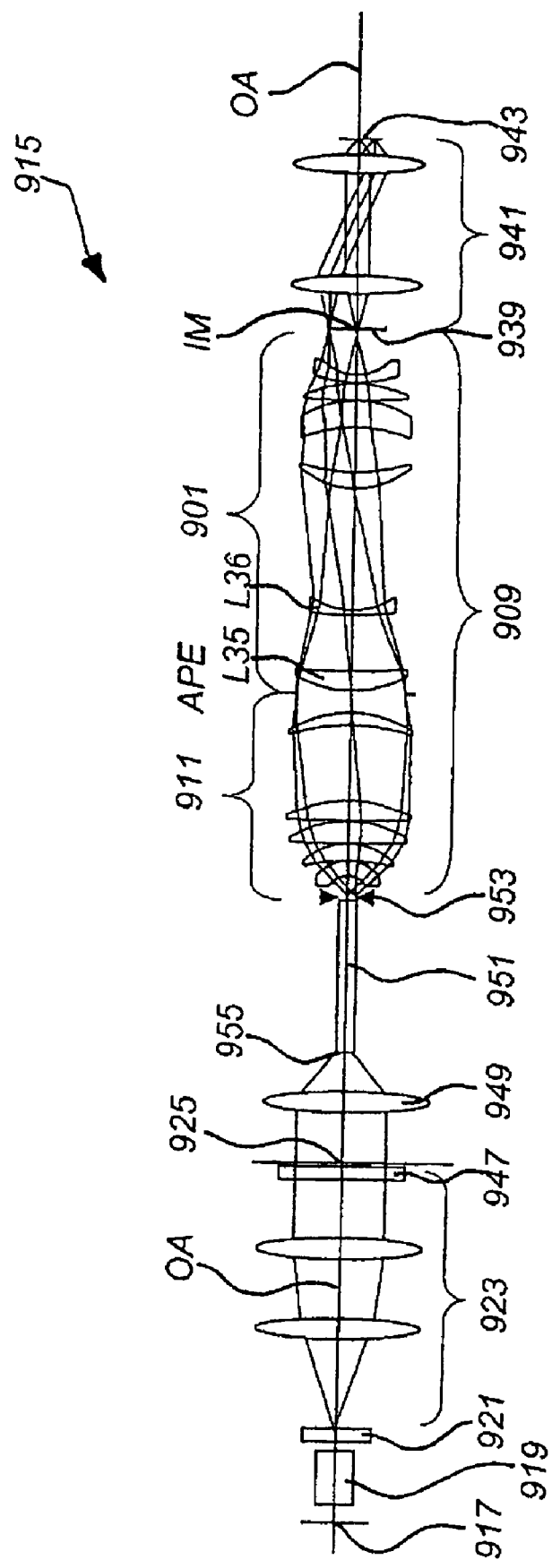
FIG. 14 shows a third embodiment of a microlithographic projection exposure apparatus with a REMA objective according to the invention, in a schematic diagram.

FIG. 14 is a schematic diagram of a third embodiment of a microlithographic projection exposure apparatus 915. The elements of FIG. 14 corresponding to the elements of FIG. 12 have the same reference numbers as in FIG. 12, increased by the number 200. Reference is made to the description of FIG. 12 for a description of these elements. In the second embodiment, however, a glass rod 951 is used for homogenizing the distribution of light. The microlithographic projection exposure apparatus 915 has, instead of the fly's eye condensor and the partial objective, a further divergence-increasing optical element 947, the coupling-in objective 949, the glass rod 951, the masking device 953 and the REMA objective 909 which images the masking device 953 onto the reticle 939. Such illuminating systems are described in U.S. Pat. No. 6,285,443. The REMA objective 909 is then identical to the REMA objective 309 of FIG. 10, the system data of which are given in Table 5.

A rectangular field in the object plane of the REMA objective 909 is illuminated by the glass rod 951; the intensity fluctuations within this field are smaller than 2%. The REMA objective 909 images this homogeneously illuminated field onto the reticle, the distribution of illumination on the reticle being nearly independent of the illumination of the aperture plane APE which was previously adjusted, for example, with a zoom axicon objective. The intensity fluctuations which are produced by the variable aperture diaphragm illumination are advantageously smaller than 1%. The intensity fluctuations within the REMA objective 909 are only ±0.2%. This is successful due to the correction of the aperture-dependent aberrations.

Figure 15:
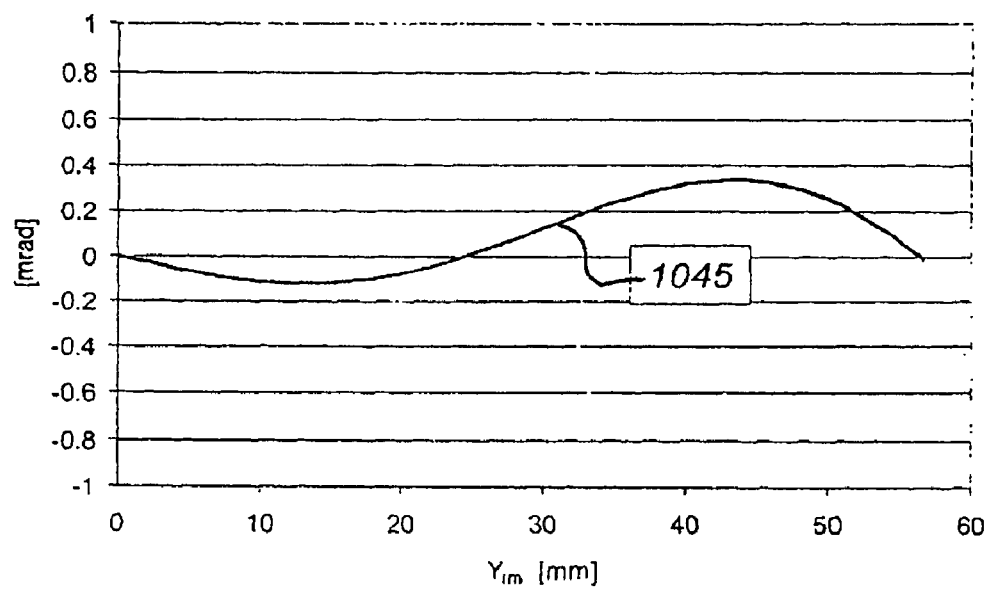
FIG. 15 shows a diagram of the deviation of the pupil function of the REMA objective of FIG. 11 from the object-side objective pupil function of a projection objective according to FIG. 8 of DE 19942281.8 (U.S. 2002/149855).

The projection objective of FIG. 13 of U.S. patent application Ser. No. 09/760,066 (U.S. 2002/0149855 A1), which has a magnification ratio of −0.25, can be used for the projection objective shown only schematically in FIG. 14. The system data are given in Table 6 of this patent, the distance between the object plane and the vertex of the lens L401 being 33.4557 mm. The pupil function of the REMA objective 909 is exactly matched to the distribution of the objective chief ray angle of the projection objective 934. FIG. 15 shows the deviation of the pupil function of the partial objective from the distribution of the objective chief ray angle as the full line 1045. The maximum deviation is 0.34 mrad.

A possibility is shown by the embodiments of providing illuminating systems which permit an undercorrection of the spherical aberration of pupil imaging in a following projection objective. Correction means within the REMA objective can thereby be saved.

What is claimed is:

1. A REMA objective for imaging an object plane onto an image plane, comprising: a condenser portion, an intermediate portion, and a lens portion proximate the image plane in a region where an absolute ray height of an outermost chief ray exceeds an absolute ray height of a marginal ray at the lens surfaces, the lens portion proximate the image plane comprising a collecting lens and diverging lens, wherein said REMA objective has a total of no more than 10 lenses with a combined total of no more than five aspheric lens surfaces, each of said condenser portion, said intermediate portion and said a lens portion proximate the image plane containing one to two aspheric lens surfaces.

2. The REMA objective according to claim 1, wherein said condenser portion comprises at least one concave surface that is curved toward said object plane.

3. The REMA objective according to claim 2, wherein for said concave surface the ratio of the radius of curvature to the lens diameter is smaller than 0.65.

4. The REMA objective according to claim 1, having an image field diameter greater than 80 mm.

5. The REMA objective according to claim 1, having an image side numerical aperture greater than 0.10.

6. The REMA objective according to claim 1, wherein a light-conducting value of the REMA objective is defined as a multiplication product of image field diameter and image-side numerical aperture of the REMA objective, and wherein said light-conducting value of the REMA objective is greater than 10 mm.

7. The REMA objective according to claim 1, wherein an image of a bright/dark edge projected from the object plane onto the image plane has a transition zone where a 5 percent brightness level and a 95 percent brightness level are mutually separated by less than 2 percent of the image field diameter.

8. The REMA objective according to claim 1, wherein said lenses comprise a condenser portion, an intermediate portion, and a lens portion proximate the image plane, and wherein the condenser portion is configured as an anterior partial objective with a condenser-portion image plane that lies at infinity and with a diaphragm that lies in said object plane of the REMA objective.

9. The REMA objective according to claim 1, wherein the REMA objective reproduces a predetermined pupil function with values of the sine of the chief ray angle, sin (i) in the range of ±10 mrad with deviations of less than ±1 mrad.

10. The REMA objective according to claim 1, wherein said intermediate portion and said a lens portion proximate the image plane are spaced from each other at a distance that is large enough such that a deflecting mirror is arranged between said intermediate portion and said a lens portion proximate the image plane.

11. A REMA objective for imaging an object plane onto an image plane, comprising: a condenser portion, an intermediate portion, and a lens portion proximate the image plane in a region where an absolute ray height of an outermost chief ray exceeds an absolute ray height of a marginal ray at the lens surfaces, the lens portion proximate the image plane comprising a collecting lens and a diverging lens, wherein said REMA objective has lenses with a total of no more than five aspheric lens surfaces, each of said condenser portion, said intermediate portion and said a lens portion proximate the image plane containing one to two aspheric lens surfaces, and wherein a glass path length through said lenses does not exceed 30 percent of a distance between said object plane and said image plane.

12. The REMA objective according to claim 11, wherein said condenser portion comprises at least one concave surface that is curved toward said object plane.

13. The REMA objective according to claim 11, wherein for said concave surface the ratio of the radius of curvature to the lens diameter is smaller than 0.65.

14. The REMA objective according to claim 11, having an image field diameter greater than 80 mm.

15. The REMA objective according to claim 11, having an image side numerical aperture greater than 0.10.

16. The REMA objective according to claim 11, wherein a light-conducting value of the REMA objective is defined as a multiplication product of image field diameter and image-side numerical aperture of the REMA objective, and wherein said light-conducting value of the REMA objective is greater than 10 mm.

17. The REMA objective according to claim 11, comprising at least one optical surface for which the maximum amount of the sine of the angle of incidence of a marginal ray in air ($|\sin (i_{edge})|$) relative to the surface normal exceeds 0.6 times the numerical aperture (NAO) on the object side.

18. The REMA objective according to claim 11, wherein an image of a bright/dark edge projected from the object plane onto the image plane has a transition zone where a 5 percent brightness level and a 95 percent brightness level are mutually separated by less than 2 percent of the image field diameter.

19. A REMA objective for imaging an object plane onto an image plane, comprising: an aperture stop in an aperture plane, a condenser portion, an intermediate portion, and a lens portion proximate the image plane, wherein all portions are centrically arranged with respect to an optical axis of the REMA objective, and the lens portion proximate the image plane is arranged in a region along the optical axis in which for a selected position along the optical axis, an absolute distance of an outermost chief ray to the optical axis exceeds an absolute distance of the marginal ray to the optical axis, wherein the outermost chief ray passes the objective through the optical axis proximate the aperture plane at a maximum angle to the optical axis, striking an edge of an image field in the image plane, and starting from an edge of an object field in the object plane, the edge of the object field being optically conjugated to the edge of the image field, and wherein the marginal ray limits a central ray bundle starting on the optical axis and limited by the aperture stop, and whose chief ray passes along the optical axis, and wherein the lens portion proximate the image plane comprises a collecting lens and a diverging lens, and the REMA objective has a total of no more than 10 lenses with a combined total of no more than five aspheric lens surfaces, and each of the condenser portion, the intermediate portion and the lens portion proximate the image plane containing one or two aspheric lens surfaces.

20. A REMA objective for imaging an object plane onto an image plane, comprising: a condenser portion, an intermediate portion, and a lens portion proximate the image plane, wherein the REMA objective has a total of no more than 10 lenses with a combined total of no more than five aspheric lens surfaces, each of the condenser portion, the intermediate portion and the lens portion proximate the image plane containing one to two aspheric lens surfaces and each comprising a collecting lens and a divergent lens.

* * * * *